US010666473B2

(12) United States Patent
Mody et al.

(10) Patent No.: US 10,666,473 B2
(45) Date of Patent: May 26, 2020

(54) TECHNIQUES FOR IMPLEMENTING A PORTABLE SPECTRUM ANALYZER

(71) Applicant: BAE Systems Information and Electronic Systems Integration Inc., Nashua, NH (US)

(72) Inventors: Apurva N. Mody, Chelmsford, MA (US); Jack Chuang, Merrimack, NH (US); Ronald Lawrence, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/473,532

(22) PCT Filed: May 5, 2017

(86) PCT No.: PCT/US2017/031358
§ 371 (c)(1),
(2) Date: Jun. 25, 2019

(87) PCT Pub. No.: WO2018/063445
PCT Pub. Date: Apr. 5, 2018

(65) Prior Publication Data
US 2019/0327006 A1    Oct. 24, 2019

Related U.S. Application Data

(60) Provisional application No. 62/400,422, filed on Sep. 27, 2016.

(51) Int. Cl.
*H04L 27/00* (2006.01)
*H04M 1/725* (2006.01)
(Continued)

(52) U.S. Cl.
CPC .......... *H04L 27/0006* (2013.01); *G01R 23/02* (2013.01); *G01R 23/16* (2013.01);
(Continued)

(58) Field of Classification Search
CPC ... H04L 27/0006; H04B 17/23; H04B 17/309; H04B 1/3833; H04B 1/16; H04B 17/391;
(Continued)

(56) References Cited

U.S. PATENT DOCUMENTS 7,466,960 B2 * 12/2008 Sugar .................. H04B 17/327
455/226.4
9,086,847 B2 *  7/2015 Filipovic ............. H04M 1/0254
(Continued)

FOREIGN PATENT DOCUMENTS

WO      2015126486 A1    8/2015
WO    WO 2015126486 A1 *  8/2015

OTHER PUBLICATIONS

International Search Report, PCT/US2017/31353, dated Jan. 4, 2018, 15 pages.
(Continued)

*Primary Examiner* — Amancio Gonzalez
(74) *Attorney, Agent, or Firm* — Finch & Maloney PLLC; Scott J. Asmus

(57) ABSTRACT

Techniques are provided for implementing a portable spectrum analyzer. An example system, according to an embodiment, includes a signal analyzer including an RF receiver to receive RF signals from an antenna, an analog-to-digital converter to generate a sampled signal based on the received RF signals, and a signal analysis co-processor to perform cognitive scanning analysis of the sampled signal. The cognitive scanning analysis includes detection, identification, and characterization of digital/analog signal(s) embedded in the sampled signal. The system may further include
(Continued)

a communications interface circuit to provide communication between the signal analyzer and an associated mobile host platform (e.g., smartphone). The communication includes transmitting results of the cognitive scanning analysis to the mobile host and receiving parameters from the mobile host to control the operation of the cognitive scanning analysis. The signal analyzer and mobile host are coupled through a shared enclosure such as a hinged case, sleeve, or wallet.

24 Claims, 21 Drawing Sheets

(51) Int. Cl.
*H04B 17/23* (2015.01)
*H04B 17/309* (2015.01)
*G01R 23/02* (2006.01)
*G06F 3/0485* (2013.01)
*G06F 3/14* (2006.01)
*H04B 1/3827* (2015.01)
*H04B 17/391* (2015.01)
*G01R 23/16* (2006.01)
*H04B 1/16* (2006.01)
*H04M 1/18* (2006.01)
*H04W 52/50* (2009.01)
*H04B 17/26* (2015.01)

(52) U.S. Cl.
CPC .......... *G06F 3/0485* (2013.01); *G06F 3/1423* (2013.01); *H04B 1/16* (2013.01); *H04B 1/3833* (2013.01); *H04B 17/23* (2015.01); *H04B 17/309* (2015.01); *H04B 17/391* (2015.01); *H04M 1/72522* (2013.01); *H04B 17/26* (2015.01); *H04M 1/185* (2013.01); *H04M 1/72527* (2013.01); *H04W 52/50* (2013.01)

(58) Field of Classification Search
CPC ........ H04B 17/26; G01R 23/02; G01R 23/16; G06F 3/0485; G06F 3/1423; H04M 1/72522; H04M 1/185; H04M 1/72527; H04W 52/50
USPC ............. 324/76.19, 76.22; 455/67.11, 226.1; 702/76
See application file for complete search history.

(56) References Cited

U.S. PATENT DOCUMENTS

| | | |
|---|---|---|
| 9,445,287 B2 | 9/2016 | Rao |
| 9,445,293 B2 | 9/2016 | Woodings |
| 9,755,869 B2 | 9/2017 | Anthony et al. |
| 10,313,164 B2 | 6/2019 | Mody et al. |
| 2004/0086027 A1 | 5/2004 | Shattil |
| 2004/0204878 A1 | 10/2004 | Anderson et al. |
| 2007/0073938 A1 | 3/2007 | Kim |
| 2007/0233336 A1 | 10/2007 | Serguei et al. |
| 2010/0195705 A1 | 8/2010 | Jallon |
| 2011/0026376 A1 | 2/2011 | Memik et al. |
| 2011/0117869 A1 | 5/2011 | Woodings |
| 2011/0191469 A1 | 8/2011 | Oran |
| 2012/0183030 A1 | 7/2012 | Turunen et al. |
| 2012/0238220 A1 | 9/2012 | Du et al. |
| 2013/0207929 A1* | 8/2013 | Farmer ................ G01R 13/029 345/174 |
| 2015/0046570 A1 | 2/2015 | Misra et al. |
| 2015/0111624 A1 | 4/2015 | Peel |
| 2016/0080955 A1 | 3/2016 | Carbajal |
| 2016/0119806 A1 | 4/2016 | Carbajal |
| 2016/0269205 A1 | 9/2016 | Anthony et al. |
| 2018/0041365 A1 | 2/2018 | Anthony et al. |
| 2019/0229959 A1 | 7/2019 | Mody et al. |

OTHER PUBLICATIONS

W.A. Brown, III and H.H Loomis, Jr.,Digital Implementations of Spectral Correlation Analyzers, IEEE Transactions on Signal Processing, vol. 41, No. 2, Feb. 1993, pp. 703-720.
International Search Report, PCT/US2014/066180, dated Jul. 30, 2015, 13 pages.
International Search Report, PCT/US2017/031358, dated Jul. 19, 2017, 14 pages.
Chad M. Spooner, Apurava N. Mody, Jack Chuang, Michael P. Anthony, Tunnelized Cyclostationary Signal Processing: A Novel Approach to Low-Energy Spectrum Sensing, 2013, IEEE Military Communications Conference, pp. 811-816.
Oscium, WiFi Spectrum Analyzer, URL:https://www.oscium.com/spectrum-analyzers/wipry-5x. Downloaded on Feb. 7, 2019, 8 pages.
SAF, Spectrum Compact Spectrum Analyzer, URL:https://www.saftehnika.com/en/spectrumanalyzer. Downloaded on Feb. 7, 2019, 6 pages.

* cited by examiner

FIG. 6A
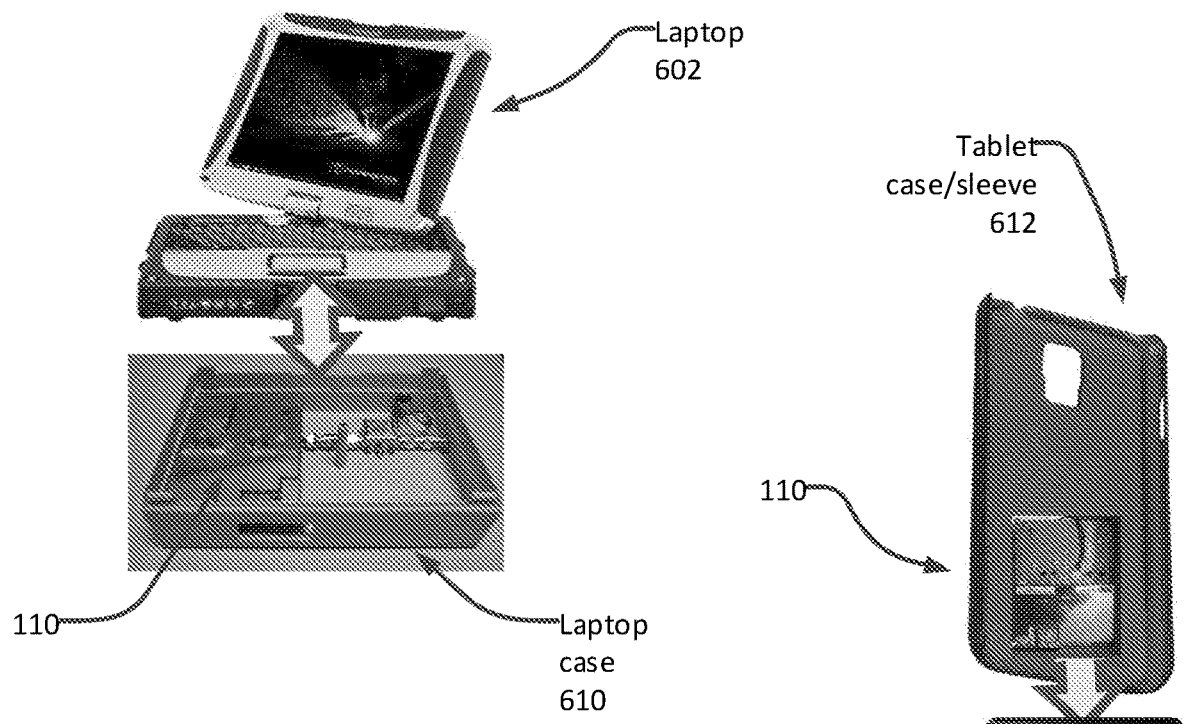
FIG. 6B
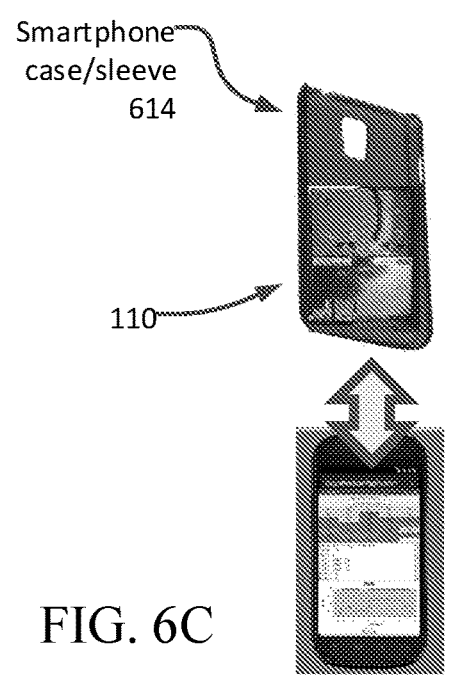
FIG. 6C 1310      1320

1600

TECHNIQUES FOR IMPLEMENTING A PORTABLE SPECTRUM ANALYZER

CROSS-REFERENCE TO RELATED APPLICATIONS

This Application claims the benefit of U.S. Provisional Patent Application No. 62/400,422, filed on Sep. 27, 2016, which is herein incorporated by reference in its entirety.

FIELD OF DISCLOSURE

The present disclosure relates to signal analysis, and more particularly, to techniques for implementing a portable spectrum analyzer.

BACKGROUND

Spectrum analyzers are devices which are typically used to measure the magnitude or power of a Radio Frequency (RF) signal with respect to frequency. Some such spectrum analyzers can also characterize parameters of the measured signal (e.g., so-called s-parameters, 3-DB bandwidth, and gain). These spectrum analyzers may be employed in any number of laboratory, commercial, and military applications. Unfortunately, however, the typical spectrum analyzers are not always adequate for certain applications. For example, spectrum analyzers used in military aircraft typically only provide a power spectral density indication, which is insufficient to provide a clear understanding of the more complex characteristics of the RF environment in which the aircraft operates, or to identify all the signals of interest that may be present in that environment. Additionally, existing spectrum analyzers tend to be relatively large (bulky) and heavy which make them difficult to deploy in the field, particularly in military and other applications where ease of mobility is important. Furthermore, extensive operator training is often required for the operation of typical spectrum analyzers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Features and advantages of embodiments of the claimed subject matter will become apparent as the following Detailed Description proceeds, and upon reference to the Drawings, wherein like numerals depict like parts.

FIGS. 6A, 6B, and 6C illustrate insertion/coupling of the signal analyzer to three types of host platforms, in accordance with certain of the embodiments disclosed herein.

Figure 1:
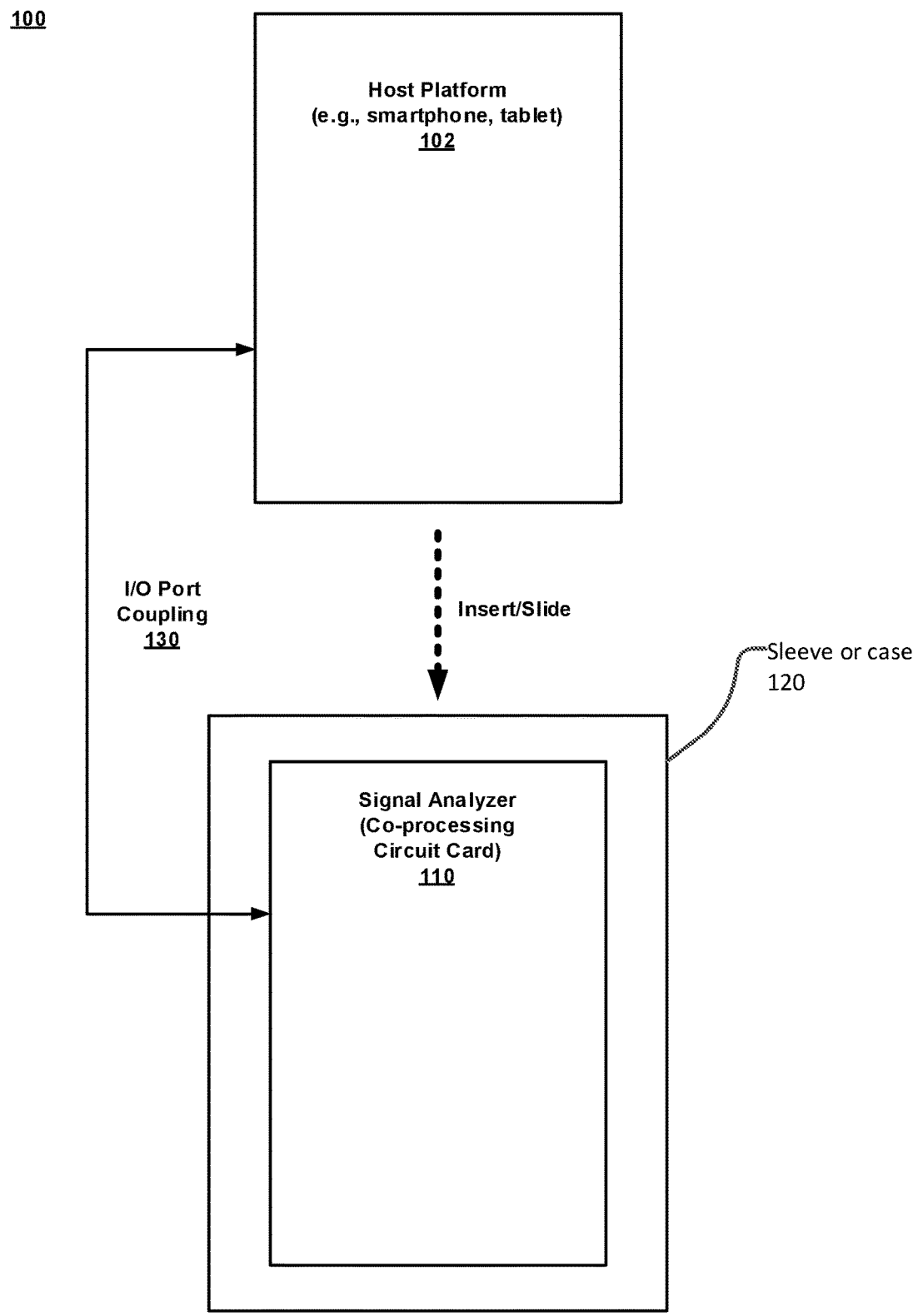
FIG. 1 illustrates a spectrum analyzer system including a host platform coupled to a signal analyzer co-processing unit, in accordance with certain of the embodiments disclosed herein.

Although the following Detailed Description will proceed with reference being made to illustrative embodiments, many alternatives, modifications, and variations thereof will be apparent to those skilled in the art.

DETAILED DESCRIPTION

General Overview

Generally, this disclosure provides techniques for implementing a spectrum analyzer, with improved signal analysis and user interface capabilities, on a portable platform. The portable platform combines a mobile computing/communication host device (such as a smartphone, tablet, or laptop), with a signal analysis co-processing circuit card. In some embodiments, the host and co-processing circuit card are integrated into a relatively small and convenient form factor such as, for example, a sleeve, a wallet, a hinged folder, or other protective casing, and are communicatively coupled through a serial interface or other suitable mechanism. The co-processing circuit card is configured to perform radio frequency (RF) signal capture and cognitive scanning analysis, including for example detection, identification, and characterization of one or more digital signals that may be embedded in the RF signal, even though the signals may overlap in time and/or frequency, as will be explained in greater detail below. The host device is configured to provide a host processor and user interface, such as a display element or touchscreen. The host processor is configured to execute an application that displays cognitive scan analysis results to the user (e.g., a "Cognitive Scan App"), and allows the user to control the spectrum analyzer through the user interface.

The disclosed techniques can be implemented, for example, in a computing system or a software product executable or otherwise controllable by such systems, although other embodiments will be apparent. The system or product is configured to provide a spectrum analyzer and associated signal analysis capabilities on a portable platform. In accordance with an embodiment, the system includes a host platform coupled to a signal analyzer co-processing unit (CU) or circuit card. In some embodiments, the CU may be embedded or otherwise integrated inside a protective casing or sleeve of the host platform, which can provide flexibility and modularity for user upgrades of the host platform and/or the CU. The overall form factor of the system is the size of about a lap top or smaller, in some embodiments. The signal analyzer includes a tunable radio frequency (RF) receiver module configured to receive RF signals, at a selected frequency and bandwidth, from an antenna; and an analog to digital (A/D) converter circuit configured to digitally sample the received RF signals. The signal analyzer also includes a signal processing system (e.g., the CU) configured to perform cognitive scanning analysis of the sampled signal. In some embodiments, the cognitive scanning analysis may include one or more of Higher-Order Statistics Analysis, Tunnelized Cyclo-Stationary processing, Strip Spectral Correlation Analysis (SSCA), Exhaustive Cyclo-Stationary Processing, and Cyclic Prefix Detection for signal detection and classification. In some embodiments, the cognitive scanning analysis may also include one or more of Clustering Analysis, Singular Value Decomposition (SVD), Support Vector Machine (SVM) techniques, Linear Discrimination Analysis, Time Frequency Pattern Analysis, Deep Neural Network (DNN), Convolutional Neural Network (CNN), and Bayesian Network (BN) based analysis. The signal analyzer further includes an interface circuit configured to provide communication to the associated host platform using any of a number of protocols, as will be described in greater detail below.

As will be appreciated in light of this disclosure, the techniques described herein may allow for improved spectrum and signal analysis (including signal characterization), in a portable form factor, compared to existing spectrum analyzers. Compact and relatively substantial processing power of existing mobile platforms is leveraged via a downloadable application, to reduce overall system bulk and complexity. The resulting decrease in size, weight, power, and cost may allow for expanded use in both military and commercial applications. Some example applications may include: quantification of available spectrum through observation, spectrum survey and report for spectrum planning and mapping, coverage analysis for wireless deployment including terrain and topology effects, threat signal identification for military operations, and identification and location of interference sources. The disclosed techniques also leverage the improved user interface capabilities of the mobile host platform with the RF and real-time processing capabilities of the co-processor circuit card, according to an embodiment. Additionally, at least some portions of these techniques can be implemented in hardware or software or a combination thereof.

Architecture

FIG. 1 illustrates a spectrum analyzer system 100 including a host platform 102 coupled to a signal analyzer 110, in accordance with certain of the embodiments disclosed herein. The host platform 102, in this example illustration, may be a smartphone or tablet, although other platform types are envisioned and described below. The host platform 102 may slide, or otherwise be inserted into, a sleeve or case 120, to which the signal analyzer 110, in the form of a co-processing circuit card, has been attached. The host platform 102 and the signal analyzer 110 are configured to communicate through an input/output (I/O) port coupling 130. In some embodiments, the I/O port coupling may be embodied in a serial interface such as an RS232 serial interface, a USB or micro-USB interface, or an Ethernet interface. In other embodiments, the coupling may be through a wireless connection of any suitable type including wireless USB, Wi-Fi, Bluetooth, ZigBee, Wi-SUN, or Near Field Connection (NFC). In some embodiments, the communication may conform with a Secure File Transfer Protocol (SFTP) or Secure Shell (SSH) communication protocol.

Figure 2:
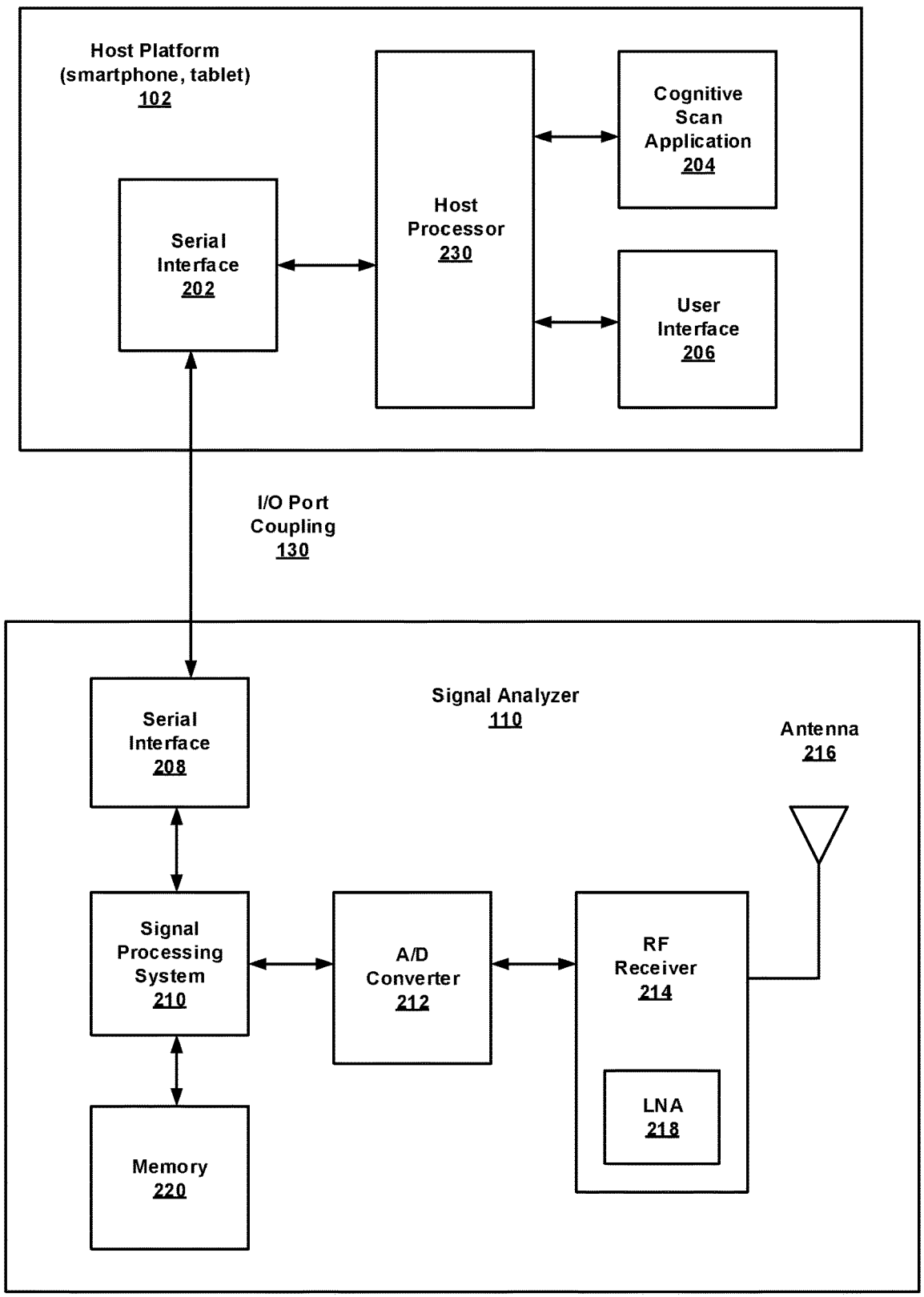
FIG. 2 is a block diagram of the host platform and signal analyzer, configured in accordance with certain of the embodiments disclosed herein.

FIG. 2 is a block diagram of the host platform 102 and signal analyzer 110, configured in accordance with certain of the embodiments disclosed herein. The host platform 102 is shown to include a serial interface circuit 202, a host processor 230, a cognitive scan application 204, and a user interface 206. The host processor 230 is configured to execute the cognitive scan application that provides a graphical user interface to display cognitive scan analysis results to the user, and accept user commands and other input, to control the spectrum analyzer, as will be described in greater detail below. The host processor 230 is also configured to communicate with the signal analyzer 110 through the interface 202, to receive cognitive scan analysis results and to transmit control and parameter information to guide the signal analysis based on user requirements. Of course, it will be appreciated that the host processor may also perform any additional operations associated with the operation of the platform to provide smartphone, tablet, or laptop functionality.

The signal analyzer is shown to include a serial interface circuit 208, a signal processing system 210, a memory circuit 220, an A/D converter 212, an RF receiver 214, a low noise amplifier (LNA) 218, and an antenna 216, the operations of which will be described in greater detail below. At a high level, however, the signal analyzer is configured to perform radio frequency (RF) signal capture and cognitive scanning analysis, including detection, identification, and characterization of one or more digital signals that may be embedded in the RF signal.

Figure 3:
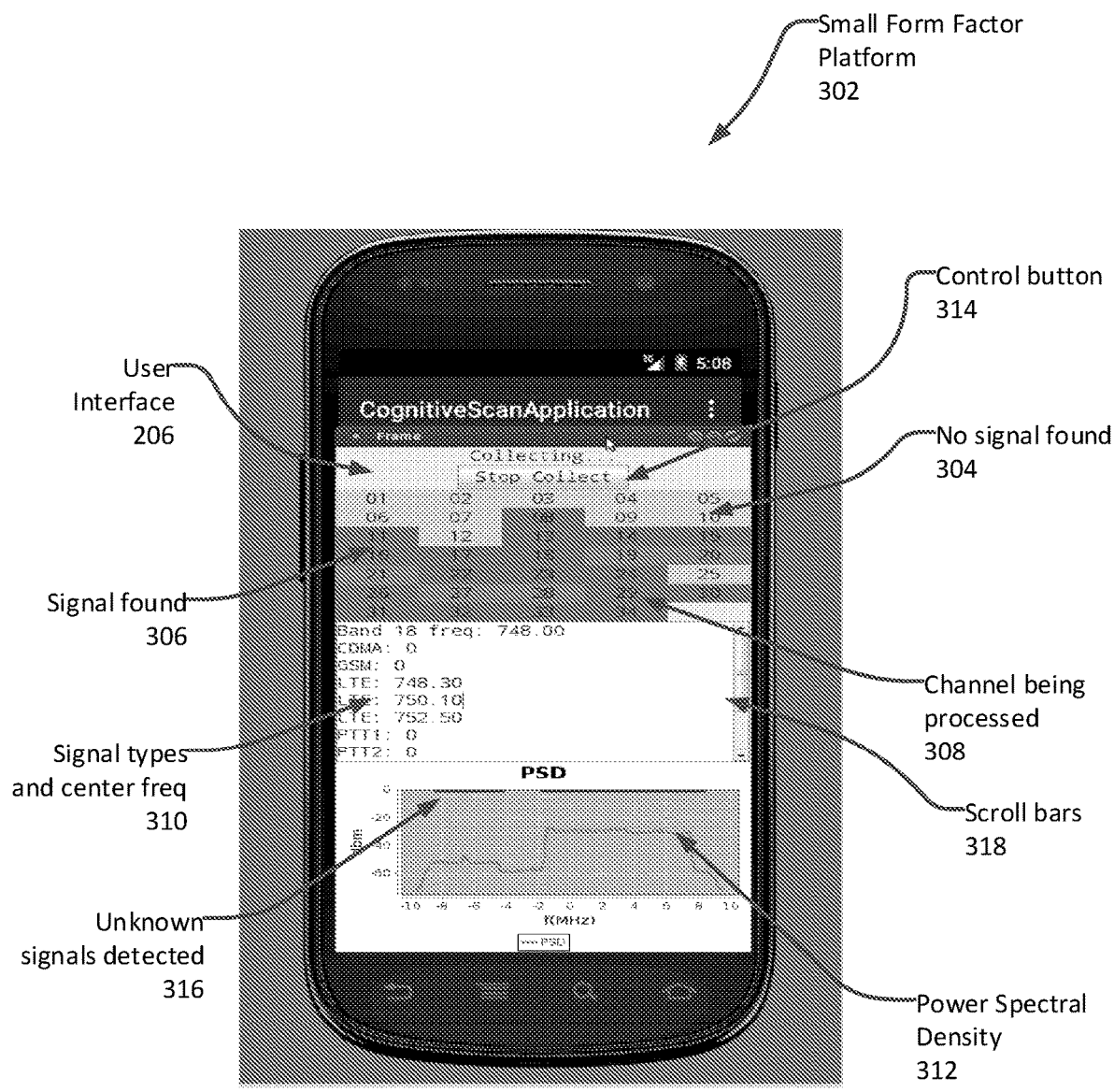
FIG. 3 illustrates a smartphone implementation of a cognitive scan application, configured in accordance with certain of the embodiments disclosed herein.

FIG. 3 illustrates a smartphone implementation of a cognitive scan application 204, configured in accordance with certain of the embodiments disclosed herein. A small form factor platform 302, such as a smartphone (in contrast to a tablet or laptop), is shown with a touch screen user interface 206. The cognitive scan application 204, executing on the host processor 230, is configured to display signal analysis information. For example, channels numbered 1 through 34 (e.g., corresponding to frequency bands) are presented in a region of the display (e.g., a window or sub-window), with color coding to indicate status. Status may include, for example, that a signal of interest (SOI) is "not found" 304 (green) or "found" 306 (red). Status may further include that a channel is being processed 308 (gray).

In some embodiments, application 204 may provide any number of touchscreen control buttons. One such example control button 314 is provided to allow the user to indicate that data collection should stop, after which the button function may toggle to "start," to indicate that data collection should resume. Signals may be selected for analysis and display by the user, for example by tapping on their label. Signals that have been selected, may be so indicated by yet another color coding. In some embodiments, a pointer arrow may be displayed to indicate the location on the screen where the user is tapping or has most recently tapped. Additional buttons may be provided to allow the user to indicate that signal analysis should start, stop, or repeat (e.g., loop).

A signal characterization window 310, is also shown, which may be configured to display parameters, classification information, or other information that has been determined by the signal analyzer. Such information may include, for example, signal frequency, bandwidth, power, Higher Order Statistics (HOS) and noise floor. Scrollbars 318 may also be provided to scroll through any of the windows. A power spectral density display 312, associated with one of the analyzed signals, is shown in an additional window on the display, along with an indicator 316 of detected but unknown signals. The analysis bandwidths may be user configurable within any range of frequencies associated with the capabilities of the hardware. In some embodiments, for example, the system's frequency range may extend from 70 MHz to 6 GHz.

In some embodiments, the user may select a screen to be displayed, or toggle between different screens or windows, from among a choice of multiple screens. The multiple screens may include, for example, a screen that displays channels that are being scanned, a screen that displays signal analysis results, and a screen that displays power spectral density plots with additional information associated with each label signal.

In some embodiments, the display is modifiable by the user to alter the types of information that may be displayed. For example, the user can view exploded images of the various windows and sub-windows, or change the location and characteristics of those windows. The user may further select or adjust the bands that are to be scanned, the signals of interest, color settings, sensitivity settings, speed of the scan, and any other suitable parameters. Other known user interface, our graphical user interface, tools and controls may also be used, in light of the present disclosure.

Figure 4:
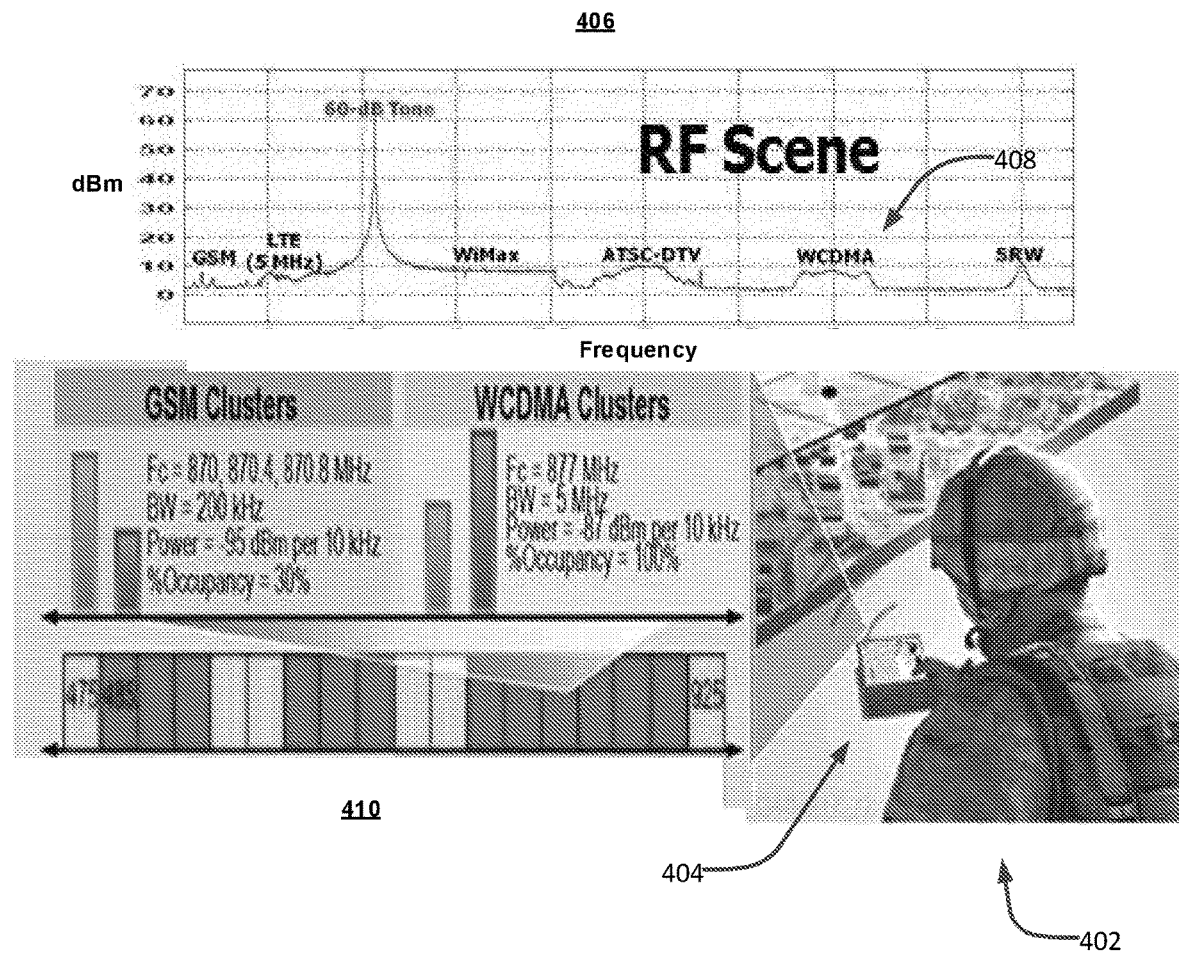
FIG. 4 illustrates handheld use of a portable spectrum analyzer, configured in accordance with certain of the embodiments disclosed herein.

FIG. 4 illustrates handheld use of a portable spectrum analyzer, configured in accordance with certain of the embodiments disclosed herein. As shown in this example, a soldier 402 may use an embodiment of the handheld portable spectrum analyzer 404 to survey the RF signal environment in a battlefield scenario. A signal spectrum 406 is displayed on the user interface and shows a number of detected and identified signals 408 including GSM, LTE, WiMax, ATSC-DTV, and WCDMA signals. Another display window 410 is shown to provide additional information about detected GSM and WCDMA signal clusters, and to indicate available and occupied channels in the spectrum, according to an embodiment.

It will be appreciated that the portable spectrum analyzer system, with improved signal detection, analysis, and characterization, as described herein, may be particularly suitable for use in a relatively large number and variety of applications. A non-exhaustive list of example applications includes the following:

- detection, characterization, and/or geolocation of sources of interference to a cellular or other wireless communications infrastructure (e.g., Wi-Fi, 4G-LTE, 5G-LTE, etc.)
- identification of unused spectrum for dynamic spectrum allocation to enable communication between combinations of defense and/or commercial systems
- identification of signals to be suppressed in a defense application
- detection and identification of unknown signals
- detection and identification of unknown signals which may be associated with threats
- spectrum characterization and usage measurement for efficiency improvements
- de-confliction of spectrum usage between military and commercial systems
- spectrum management
- spectrum mapping
- on-demand spectrum survey and report generation
- spectrum planning and allocation
- identification of spectrum users
- collaborative spectrum measurement and calibration
- coverage analysis for wireless deployment
- terrain and topology analysis for determination of signal shadowing and fading effects
- identification and prediction of space-time-frequency spectrum holes where non-time-sensitive tasks can be performed at certain times and at certain locations, when the spectrum use is sparse or non-existent For example, a user of the portable spectrum analyzer may be a soldier in a military application or a technician in a commercial application. The user is tasked to deploy the system, whether in a vehicle or on foot, to survey the RF environment at a series of remote locations, for any of the purposes listed above or for any other suitable purpose.

Figure 5A:
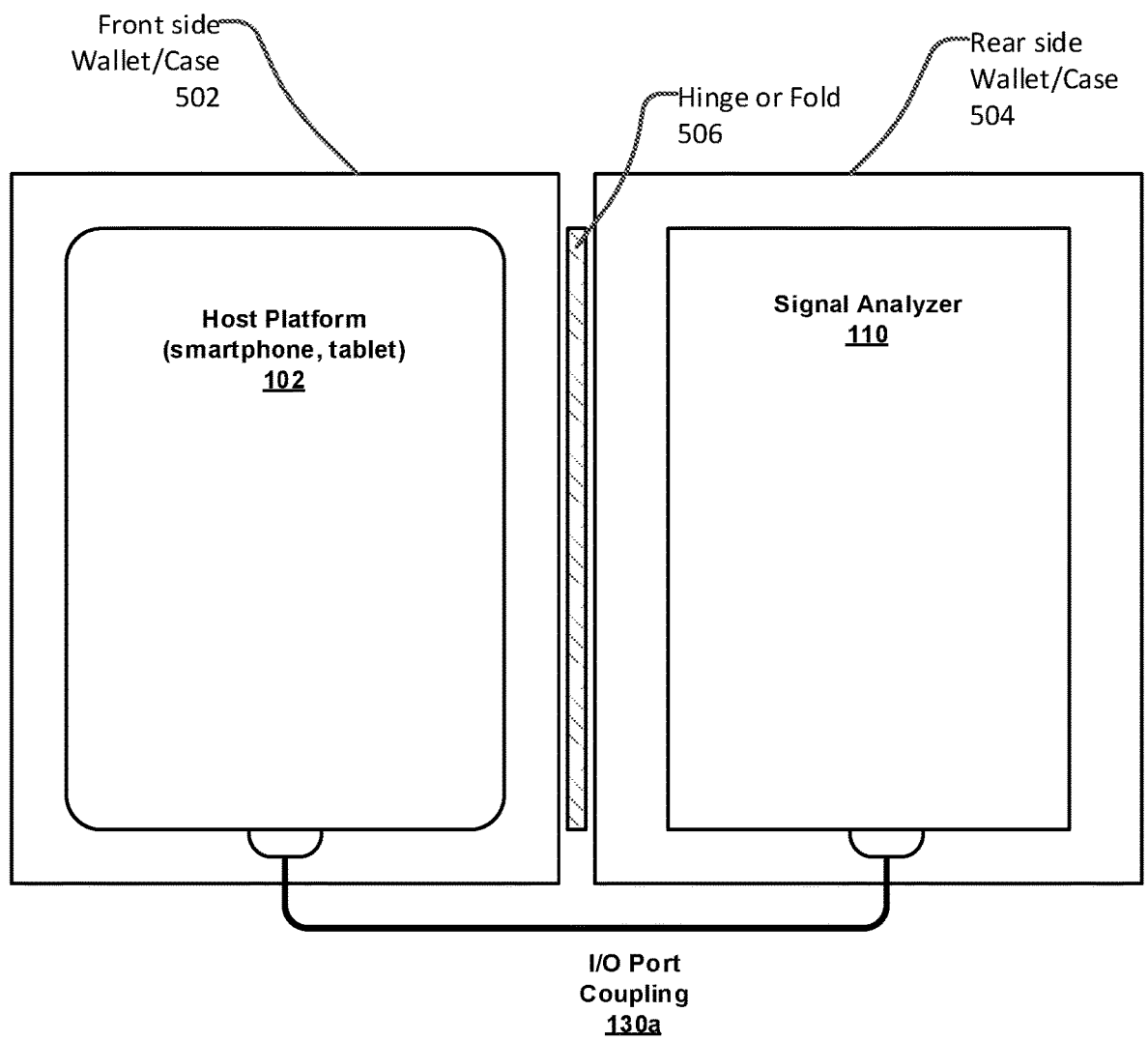
FIGS. 5A and 5B illustrates a folding wallet or case to enclose the host platform and the signal analyzer, configured in accordance with certain of the embodiments disclosed herein.

FIG. 5A illustrates a folding wallet or case 500 to enclose the host platform and the signal analyzer, configured in accordance with certain of the embodiments disclosed herein. The enclosure 500 is shown to include a front side 502 and a rear side 504 connected by a hinge 506. In some embodiments, the hinge 506 may be replaced by a fold or crease. The front side 502 is shown to enclose or retain the host platform 102, such as a smartphone or tablet. The rear side 504 is shown to enclose or retain the signal analyzer circuit card 110. The host platform 102 and the signal analyzer 110 are coupled through an I/O port connection 130a, which may be a serial interface cable, a wireless connection, or any other suitable coupling mechanism, in light of the present disclosure.

Figure 5B:
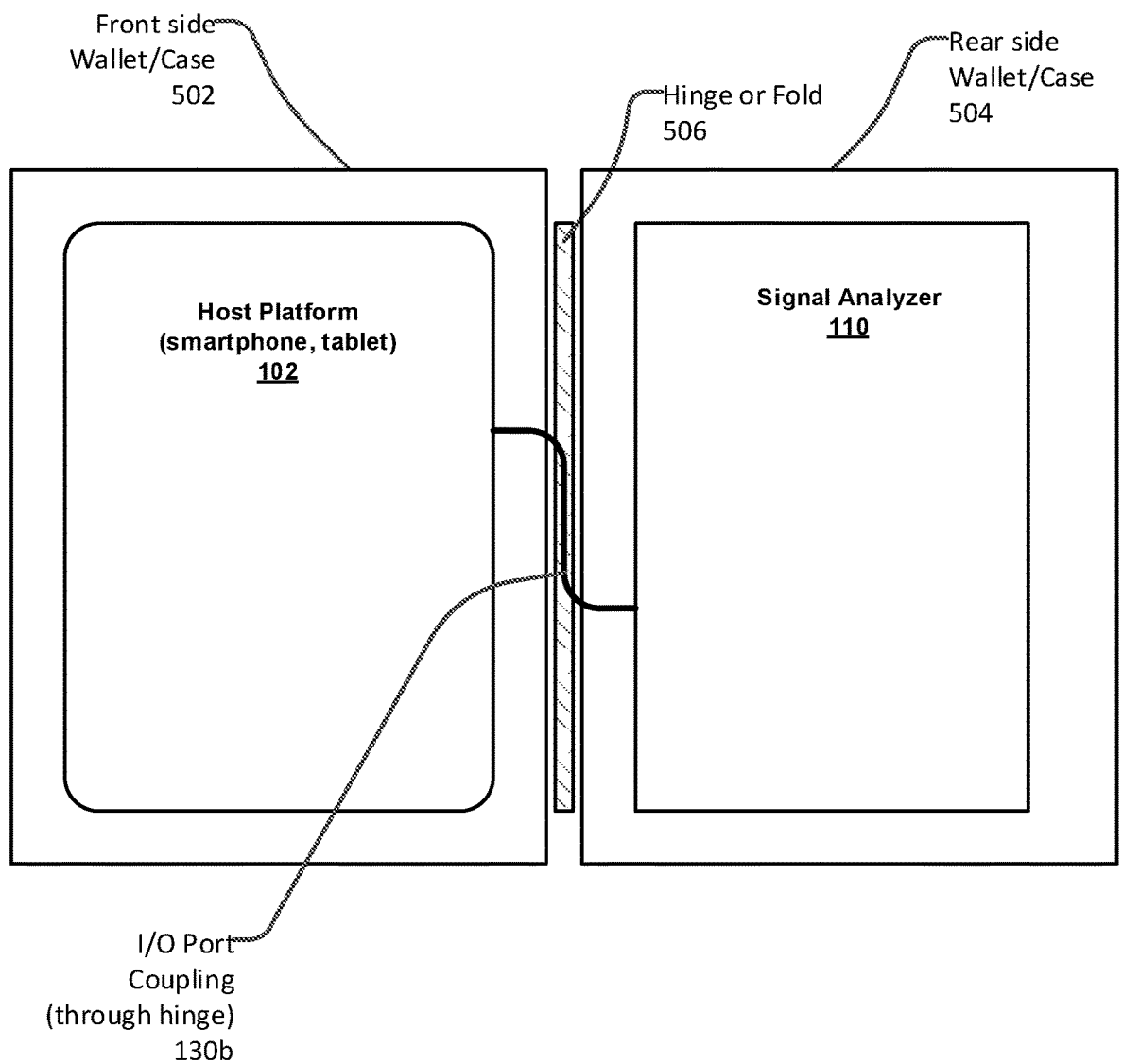

FIG. 5B illustrates another example of the folding wallet or case 500 to enclose the host platform and the signal analyzer, configured in accordance with certain of the embodiments disclosed herein. In this embodiment, the host platform 102 and the signal analyzer 110 are coupled through an I/O port connection 130b, which may be a flexible interface cable that routes through the hinge in a concealed manner. In still other embodiments, host platform 102 may communicate with signal analyzer 110 using wireless techniques.

Additional configurations are possible. For example, in a further embodiment, the host platform 102 may be contained in a first case and the signal analyzer 110 may be contained in a second separate case. The host platform and the signal analyzer are coupled together via the interface (wired or wireless) and the combination is collectively considered to be a shared case.

FIGS. 6A, 6B, and 6C illustrate insertion/coupling of the signal analyzer to three types of host platforms, in accordance with certain of the embodiments disclosed herein. In FIG. 6A, a laptop host platform 602 is shown to be inserted into an enclosure case 610 which is configured to hold the laptop 602 and the signal analyzer circuit card 110. In some embodiments, the enclosure case 610 may be a ruggedized case configured for use in military or other severe environments. In FIG. 6B, a tablet host platform 604 is shown to be inserted into a tablet case/sleeve 612 which is configured to hold the tablet 604 and the signal analyzer circuit card 110. In FIG. 6C, a smartphone host platform 606 is shown to be inserted into a smartphone case/sleeve 614 which is configured to hold the smartphone 606 and the signal analyzer circuit card 110. Note that the use of the terms "enclosure" or "case" as used herein is not intended to be limited to housing or packaging that fully encloses or fully covers components of the portable system. Rather, the enclosure or case as used herein may only partially cover or otherwise contain the system, and may further open or expand to more fully expose the system during usage. Any number of enclosure/case arrangements that facilitate the portability and use of the system will be appreciated in light of this disclosure.

Figure 7:
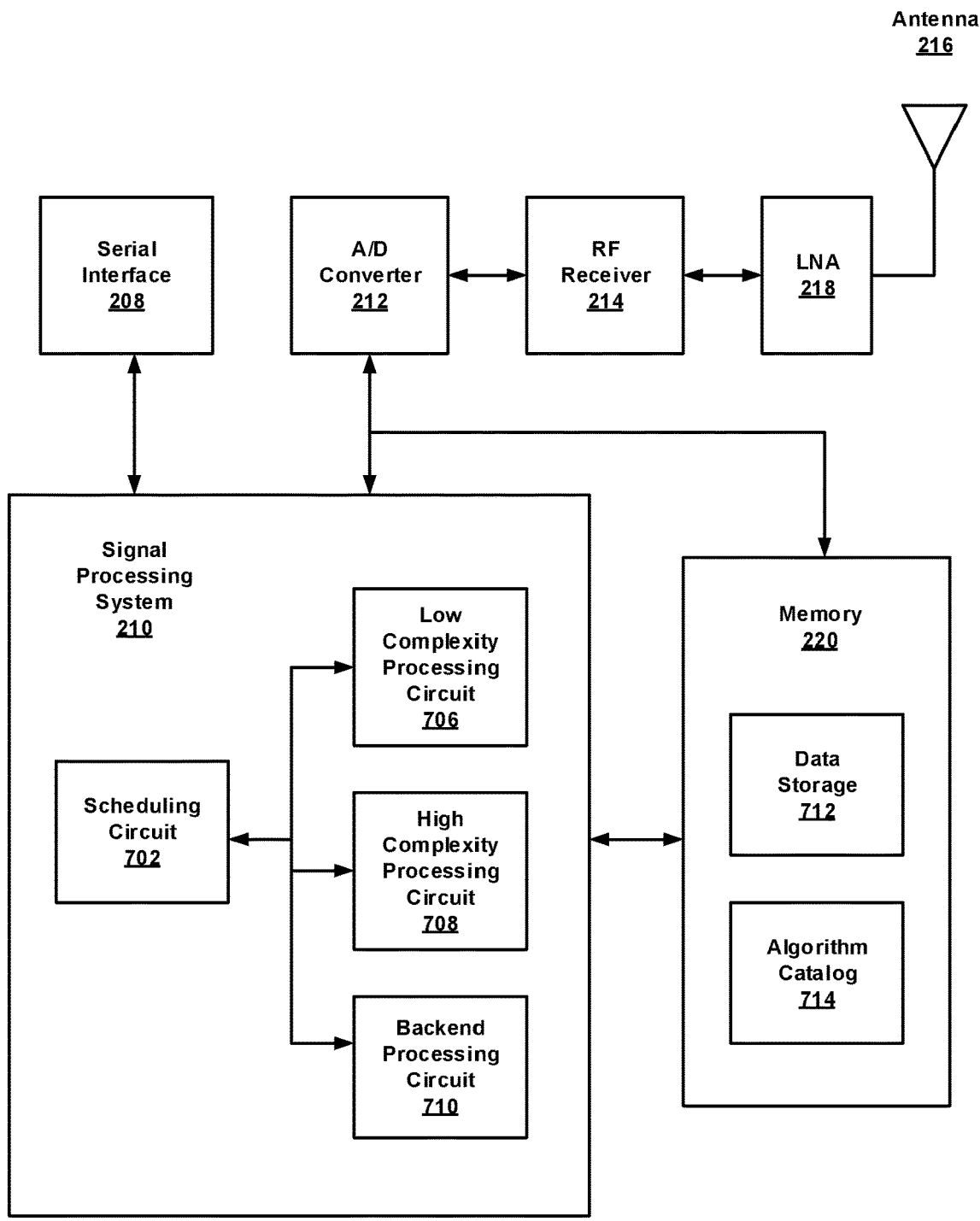
FIG. 7 is a more detailed block diagram of the signal analyzer, configured in accordance with certain of the embodiments disclosed herein.

FIG. 7 is a more detailed block diagram of the signal analyzer 110, configured in accordance with certain of the embodiments disclosed herein. The signal analyzer is shown to include serial interface circuit 208, signal processing system 210, memory circuit 220, A/D converter 212, RF receiver 214, and antenna 216.

RF receiver 214 is configured to receive RF signals from antenna 216. In some embodiments, one or more antennas 216 may be coupled to the RF receiver via a low noise amplifier LNA 218, for example to provide increased sensitivity to relatively weaker signals. RF receiver 214 may be further configured to mix (e.g., down-convert or translate) the RF signal from a relatively high RF tuning frequency to a lower intermediate frequency (IF) or baseband frequency. A/D converter 212 is configured to sample the RF signal (or IF or baseband signal) to generate a sampled signal for subsequent digital processing. The LNA 218, RF receiver 214 and A/D converter 212 may be referred to collectively as the "RF front end" of the signal analyzer 110, and may, in some embodiments, be incorporated into an RF integrated circuit (RFIC).

Memory circuit 220 is configured for data storage 712, to store data provided by the A/D converter 212, for processing by signal processing system 210. In some embodiments, memory circuit 220 is also configured to store a library or catalog 714 of signal parameters and signal processing algorithms to be executed by signal processing system 210.

Serial interface circuit 208 is configured to provide a communication link between the signal analyzer 110 and the associated mobile host platform 102 (e.g., through serial interface circuit 202 of the host platform). In some embodiments, the serial interface circuit is configured to support one or more of a universal serial bus (USB) communications link, a micro-USB communications link, an Ethernet communications link, and a wireless communications link. In some embodiments, the interface circuit 208 may support other existing, or yet to be developed, communication protocols, in light of the present disclosure. The communication between signal analyzer 110 and host platform 102 may include transmission of results of the cognitive scanning analysis to the host and receiving of parameters from the host to control and/or configure the operation of the cognitive scanning analysis.

Signal processing system 210 is configured to perform cognitive scanning analysis of the sampled signal, to detect, identify, and/or characterize one or more digital signals that may be embedded in the sampled signal. Signal processing system 210 is further shown to include a scheduling circuit 702, a low complexity processing circuit 706, a high complexity processing circuit 708, and a backend processing circuit 710, the operations of which will be explained below. In some embodiments, the signal processing system 210 may be implemented as an application-specific integrated circuit (ASIC), a Field programmable gate array (FPGA), a digital signal processor (DSP), a general purpose graphical processing unit (GPGPU or simply GPU), a general-purpose processor (CPU), or an Advanced Reduced instruction set computing Machine (ARM) processor.

Scheduling circuit 702 is configured to control the tuning frequency and bandwidth of the RF receiver 214, and the sampling rate and data collection parameters of the A/D converter 212. Scheduling circuit 702 also controls/schedules the bands and the classes or categories of signal types that are to be detected and processed. In some embodiments, the wireless capabilities of the host platform (e.g., Wi-Fi, 4G/5G LTE, etc.) may be used to provide connectivity between the cognitive scanning system and a remote spectrum and sensing management system, as will be described in greater detail below. In such case, the scheduling circuit 702 may be configured to generate timeslots where the spectrum sensing operations does not overlap with the communications operations of the host platform. Additionally, or alternatively, sufficient isolation may be provided between the signal analyzer antenna and an antenna of the host system (e.g., a smartphone antenna) such that signals from one antenna do not cross couple or otherwise interfere with the other antenna.

Low complexity processing circuit 706 is configured to perform Higher-Order Statistics analysis and/or Tunnelized Cyclo-Stationary processing, to detect embedded digital signals. High complexity processing circuit 708 is configured to perform Cyclic Prefix Signal Detection and/or Exhaustive Cyclo-Stationary Processing, Clustering Analysis, SVD, SVM, DNN, CNN, BN, and other algorithms to detect unknown signals.

Cyclo-Stationary Processing is configured to detect combinations of cycle frequencies that are present in man-made signals and can be correlated to signal features such as symbol rates, chip rates, and hop rates, which provide a distinct pattern for a given signal type. These identified cycle frequencies may be compared to a library of known signal types for identification. If the pattern does not match examples in the library, the pattern can be stored and analyzed offline or otherwise used for future reference. Machine learning techniques (e.g., SVM, DNN, CNN) may be employed on the stored patterns to discern the signal types.

Narrowband tunneling is configured to under-sample and distort the original signal while retaining recognizable cyclo-stationary properties. Such tunneling can reduce the complexity of the signal processing by as much as a factor of 10 by exploiting the signal stationarity that is present in narrow bandwidth slices. In some embodiments, this technique may provide up to 40 dB of adjacent channel rejection (e.g., dynamic range improvement). In some embodiment, signal detection may employ other known techniques, in light of the present disclosure.

Backend processing circuit 710 is configured to classify (e.g., identify and/or characterize) the digital signals detected by processing circuits 706 or 708. In some embodiments, the classification is based on one or more of Exhaustive Cyclo-stationary Processing using algorithms such as SSCA, Clustering Analysis, Support Vector Machine (SVM) techniques, Linear Discrimination Analysis, and Time Frequency Pattern Analysis, Deep Neural Networks, Convolutional Neural Networks or Bayesian Networks. In some further embodiments, the Time Frequency Pattern Analysis employs Deep Neural Networks, Bayesian Networks, and/or Hidden Markov Models. In some embodiment, signal classification may employ other known techniques, in light of the present disclosure.

The disclosed techniques may allow for detection and characterization of RF signals at signal-to-noise ratios ranging from −8 dB to 40 dB, with a probability of detection and correct signal characterization exceeding 95%, and a probability of false alarm classification less than 5%, depending on sensing times, according to an embodiment.

Figure 8:
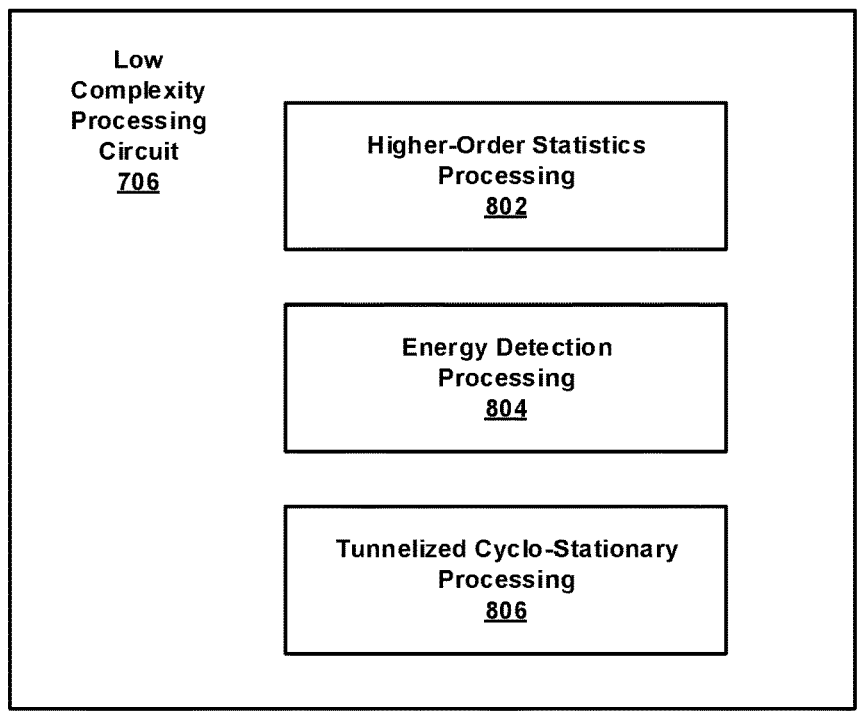
FIG. 8 is a more detailed block diagram of the signal analyzer processing circuits, configured in accordance with certain of the embodiments disclosed herein.
Figure 8:
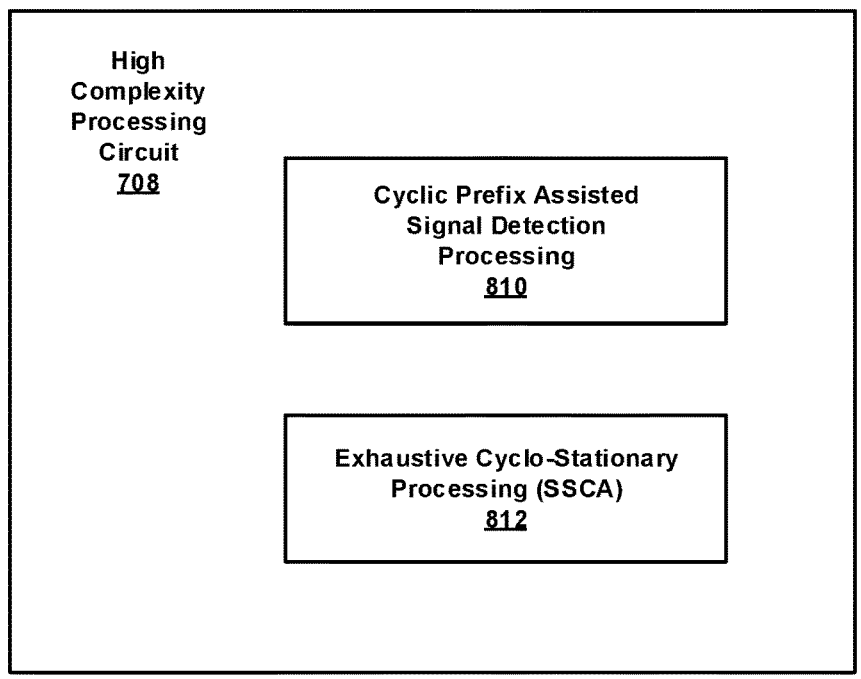

FIG. 8 is a more detailed block diagram of the signal analyzer processing circuits 706 and 708, configured in accordance with certain of the embodiments disclosed herein. In some embodiments, low complexity processing circuit 706 is configured to perform one or more of Higher-Order Statistics processing 802, energy detection processing 804, and Tunnelized Cyclo-Stationary processing 806. In some embodiments, high complexity processing circuit 708, is configured to perform one or more of Cyclic Prefix Assisted Signal Detection 810 and Exhaustive Cyclo-Stationary Processing 812.

Figure 9:
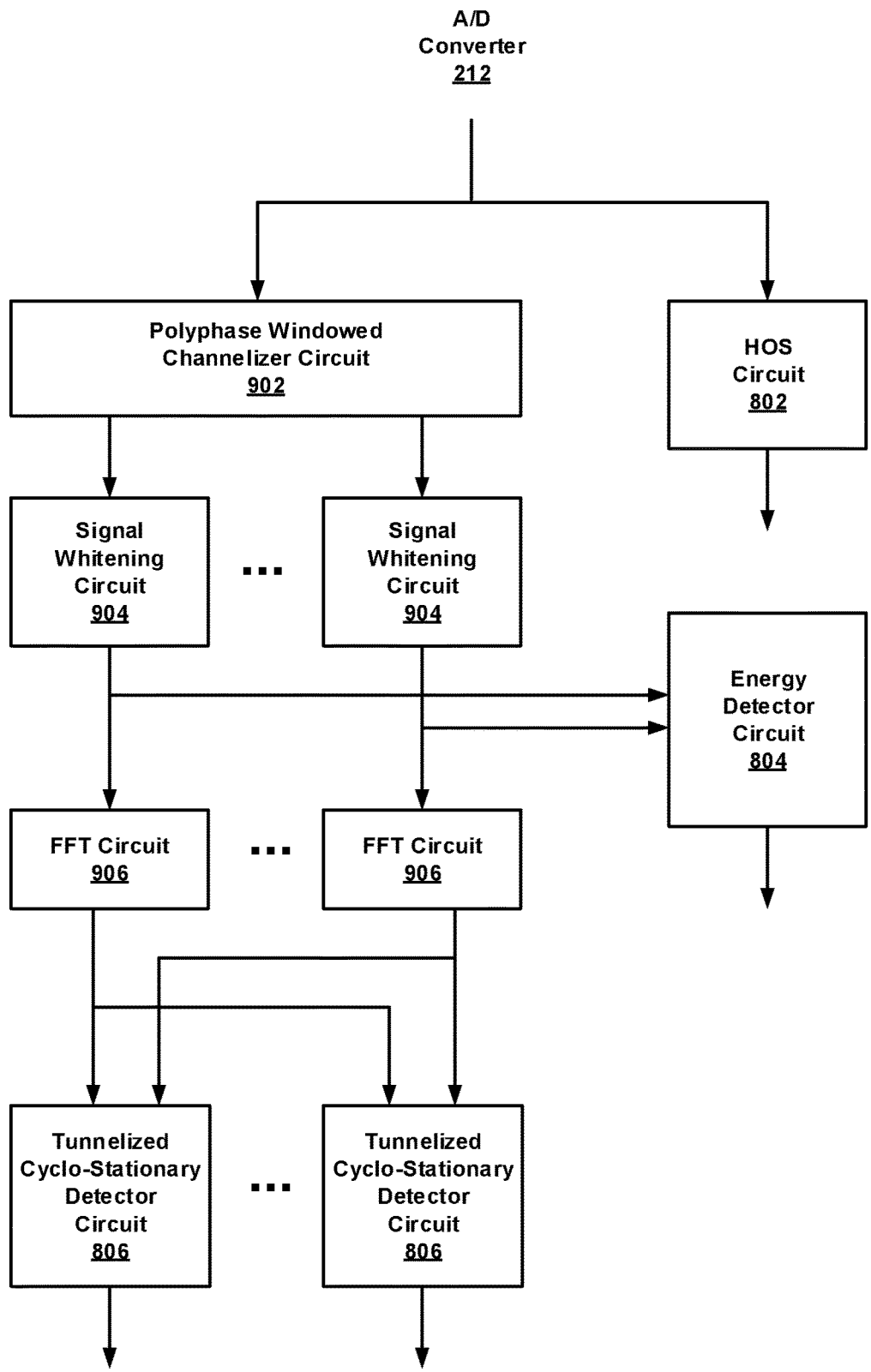
FIG. 9 is a more detailed block diagram of the signal analyzer low complexity processing circuit, configured in accordance with certain of the embodiments disclosed herein.

FIG. 9 is a more detailed block diagram of the signal analyzer low complexity processing circuit 706, configured in accordance with certain of the embodiments disclosed herein. The low complexity processing circuit 706 is shown to include a polyphase windowed channelizer circuit 902, a signal whitening circuit 904, an FFT circuit 906, a Tunnelized Cyclo-Stationary Detector circuit 806, a Higher-Order Statistics (HOS) circuit 802, and an energy detector circuit 804. In some embodiments, the Higher-Order Statistics circuit 802 is configured to provide relatively rapid detection of structured energy in the sampled signal provided by the A/D converter 212. In some embodiments, the energy detector circuit 804 is configured to perform a power spectral density analysis, estimate the signal strength, and detect the presence of unknown signals. In some embodiments, one of the Tunnelized Cyclo-Stationary Detector circuits 806 may be configured to detect ATSC-DTV signals, and another of the Tunnelized Cyclo-Stationary Detector circuits 806 may be configured to detect LTE, WCDMA, CDMA-Group (EvDO) signals.

Figure 10:
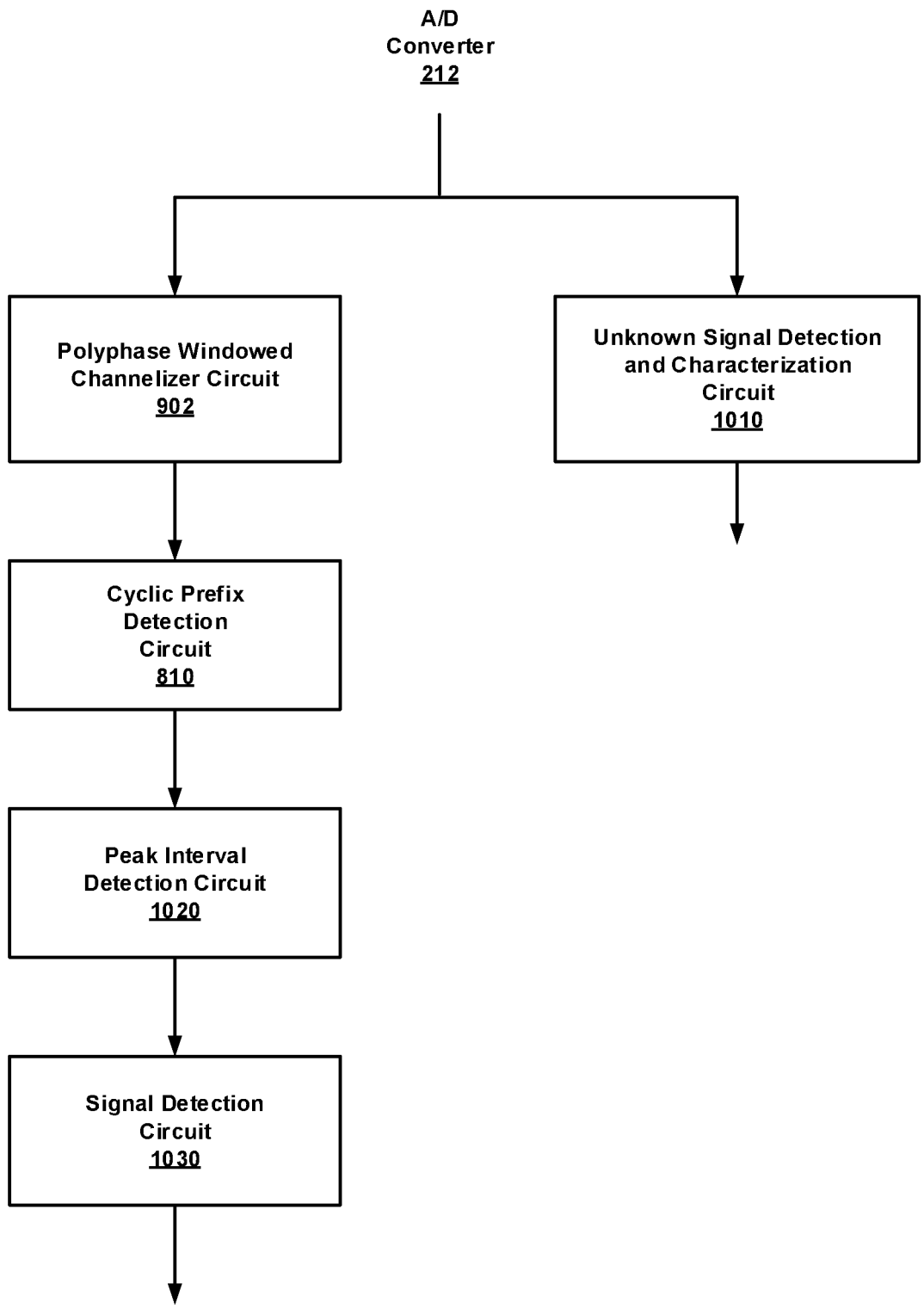
FIG. 10 is a more detailed block diagram of the signal analyzer high complexity processing circuit, configured in accordance with certain of the embodiments disclosed herein.

FIG. 10 is a more detailed block diagram of the signal analyzer high complexity processing circuit 708, configured in accordance with certain of the embodiments disclosed herein. The high complexity processing circuit 708 is shown to include the polyphase windowed channelizer circuit 902, a Cyclic Prefix Detection circuit 810, a peak interval detection circuit 1020, a signal detection circuit 1030, and an unknown signal detection and characterization circuit 1010. In some embodiments, the signal detection circuit 1030 may be configured to detect DVB-T signals based on interval timing estimated by the peak interval detection circuit 1020 from the output of the Cyclic Prefix Detection circuit 810. In some embodiments, the unknown signal detection and characterization circuit 1010 may be configured to detect and characterize signal types that have not been previously observed. The detection and characterization may be based on second and higher-order Cyclo-Stationary processing, clustering, Singular Value Decomposition, Support Vector Machines, Deep Neural Networks, Convolutional Neural Networks, and/or other Bayesian Networks.

Figure 11:
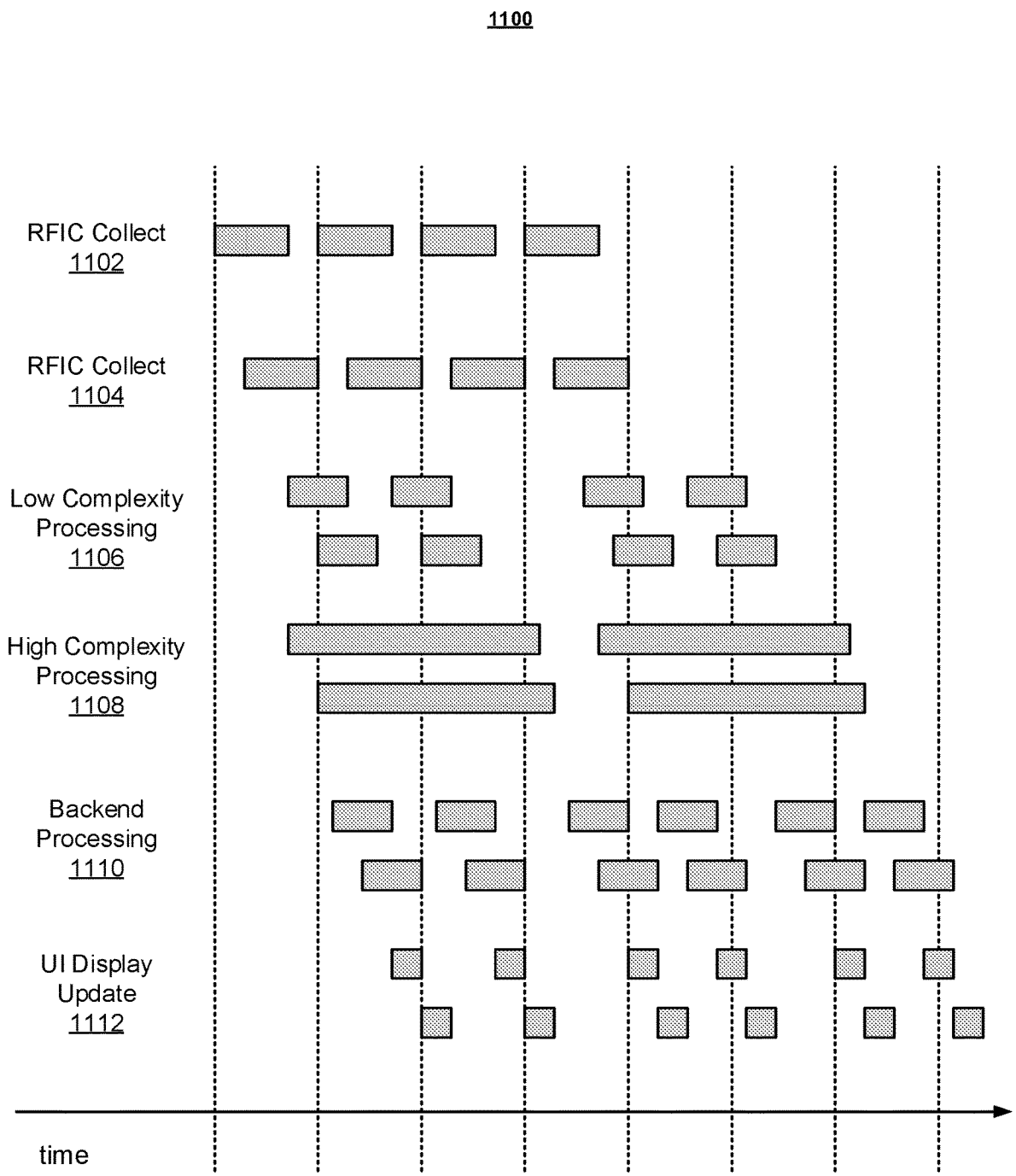
FIG. 11 illustrates a cognitive scan timing diagram, in accordance with certain of the embodiments disclosed herein.

FIG. 11 illustrates a cognitive scan timing diagram 1100, in accordance with certain of the embodiments disclosed herein. In some embodiments, the RF integrated circuit (RFIC) (e.g., A/D converter 212 or RF front end) may comprise multiple channels configured for parallel data collection, and signal processing system 210 may comprise multiple processors or cores configured for parallel processing. This is illustrated in the timing diagram 1100, where RFIC collects data one a first channel 1102 in parallel with a second channel 1104. Low complexity processing 1106 may be distributed between two processing cores, and high complexity processing 1108 may be distributed between an additional two processing cores. Backend processing 1110 is shown to occur further down the processing pipeline (e.g., later in time) as it may depend upon the results of low complexity processing 1106 and high complexity processing 1108. The user interface display, or graphical user interface (GUI), update 1112 is shown to follow the backend processing 1110, and is performed by the platform host processor 230.

Figure 12:
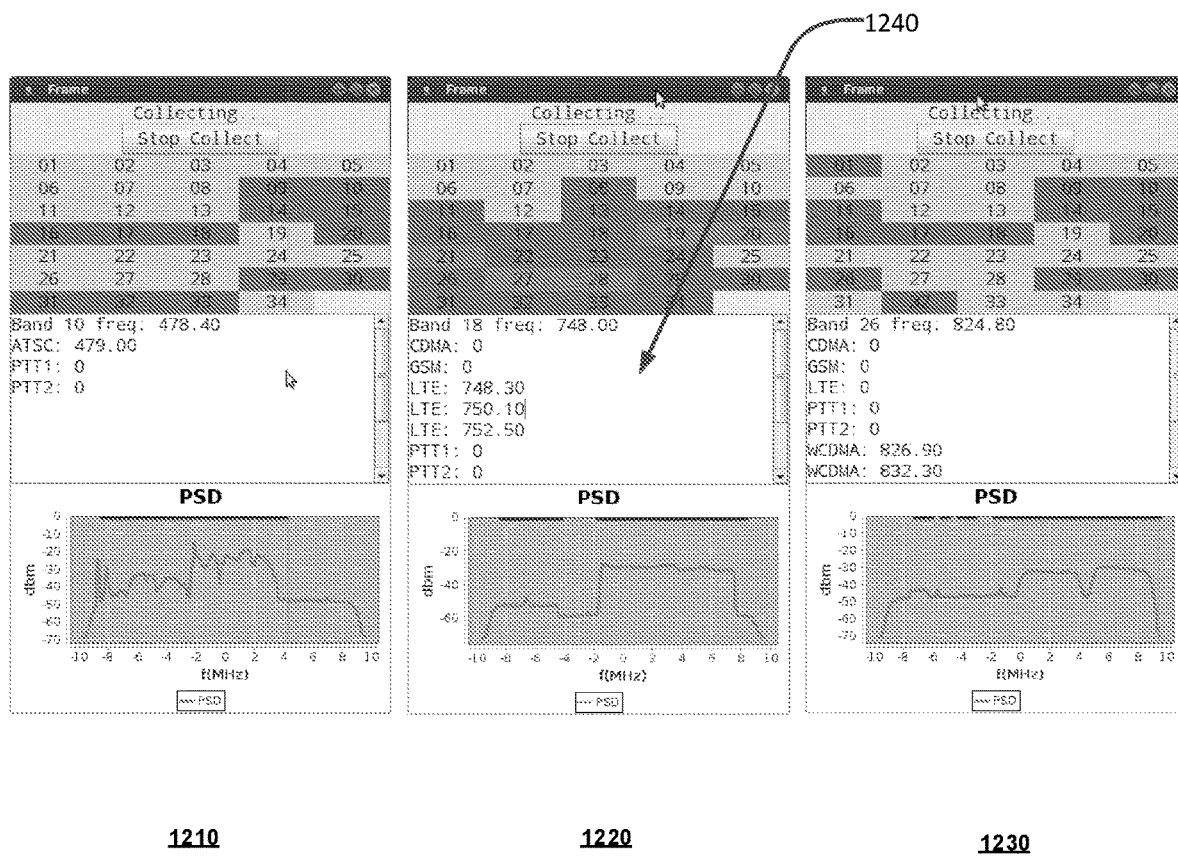
FIG. 12 illustrates user interface display examples, in accordance with certain of the embodiments disclosed herein.
Figure 13:
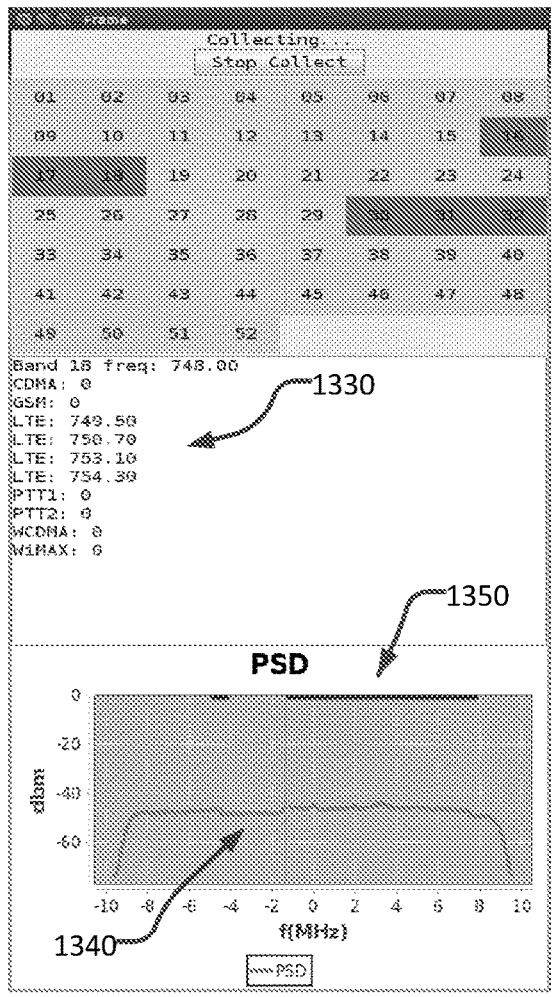
FIG. 13 illustrates additional user interface display examples, in accordance with certain of the embodiments disclosed herein.
Figure 13:
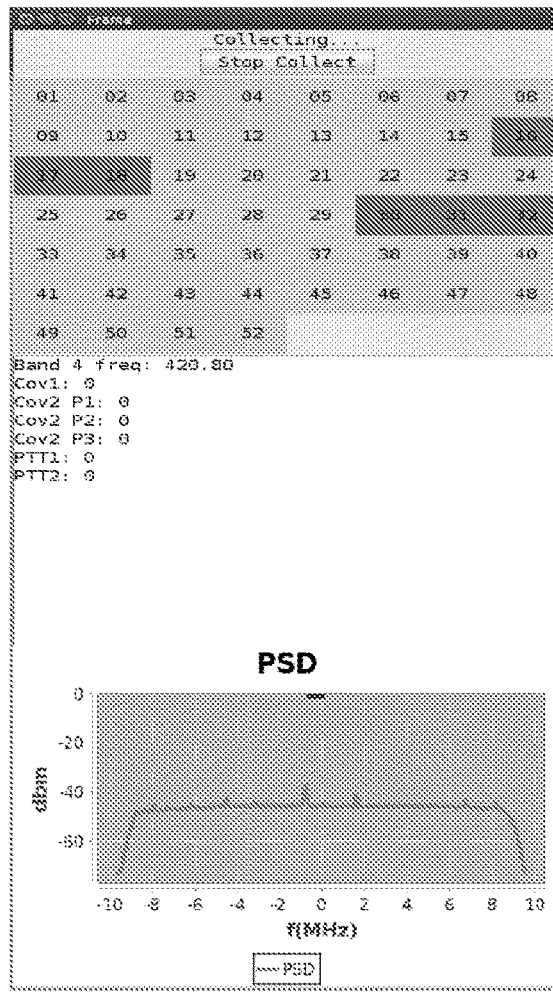

FIGS. 12 and 13 illustrate additional examples of user interface displays, in accordance with certain of the embodiments disclosed herein. In FIG. 12, a power spectral density plot 1210 is shown for a received signal in frequency band 10. Similarly, power spectral density plots 1220, 1230 are shown for received signals in frequency bands 18 and 26. Additionally, as shown in the scrollable information window, information about the detected signal is displayed 1240, including the channel or band number and the center frequency. Similar displays are shown in FIG. 13, for band 18 as 1310 and band 4 as 1320. A listing of four detected LTE signals 1330, along with frequencies, is shown in band 18 along with the power spectral density plot 1340. The blue line 1350 at the top of the power spectral density plots indicates the output of the energy detection circuit 804. No signals have been identified in band 4.

Figure 14A:
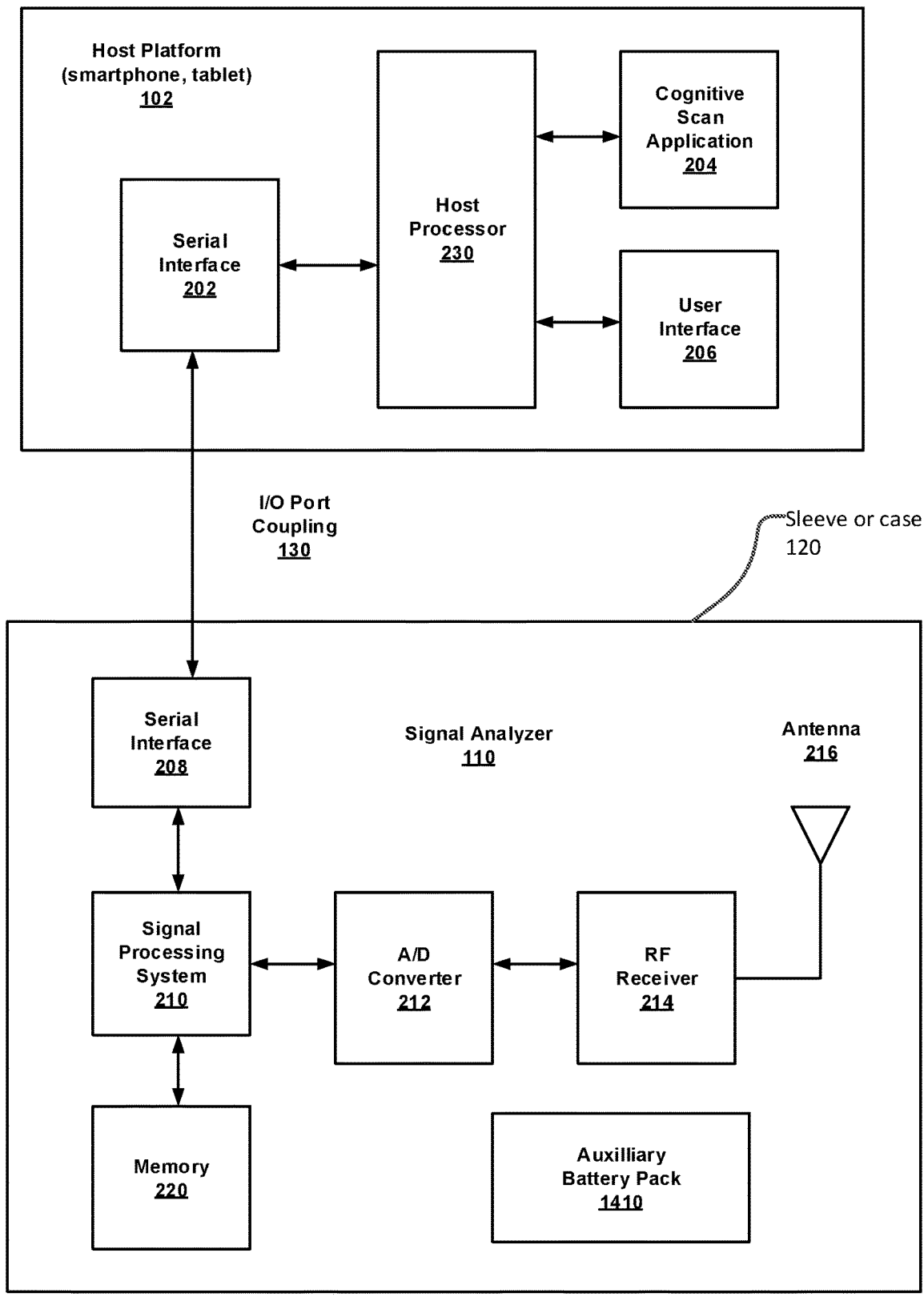
FIGS. 14A, 14B, and 14C illustrate example configuration variations of the spectrum analyzer system host platform and signal analyzer co-processing unit, in accordance with certain of the embodiments disclosed herein.
Figure 14B:
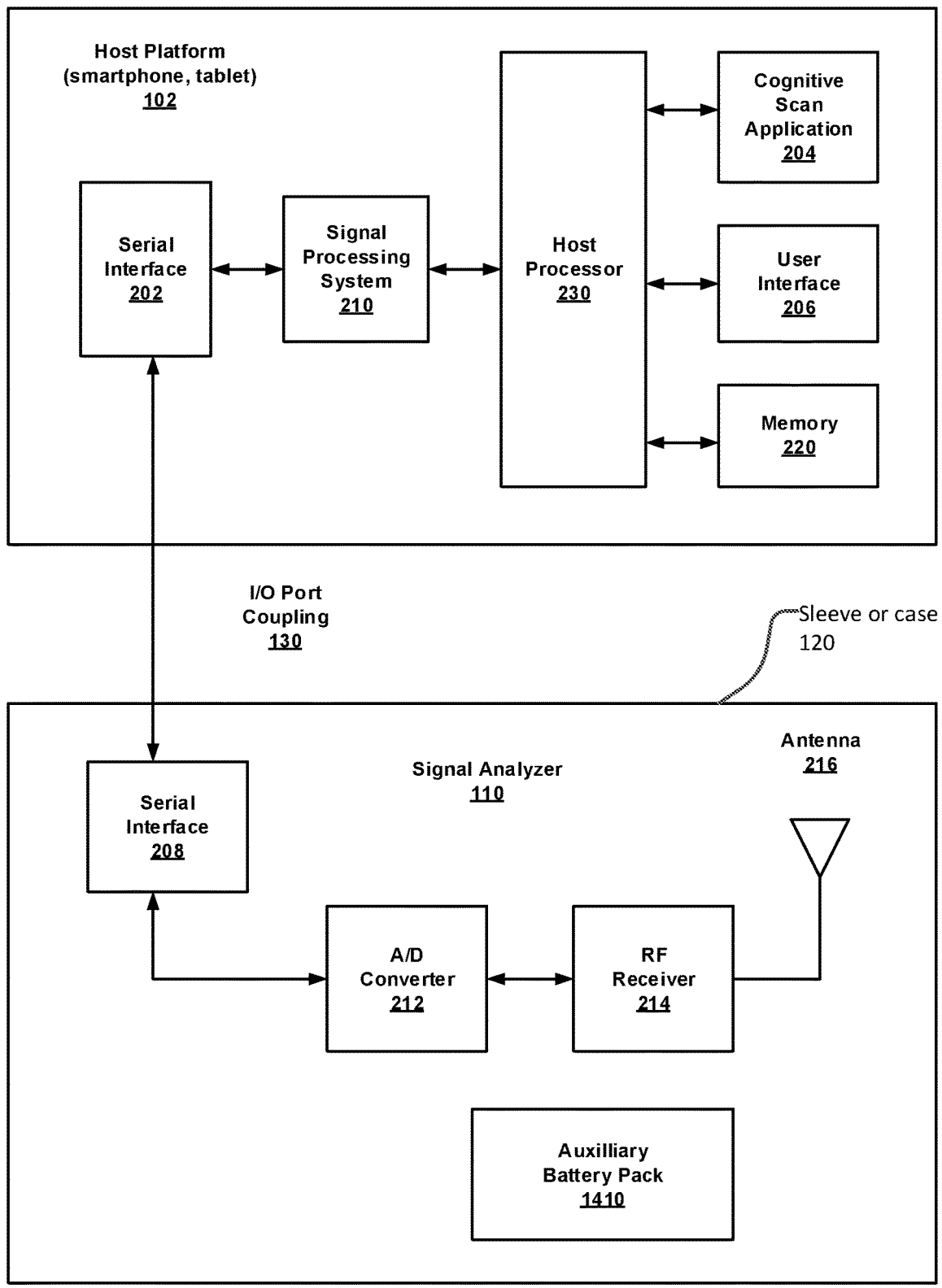
Figure 14C:
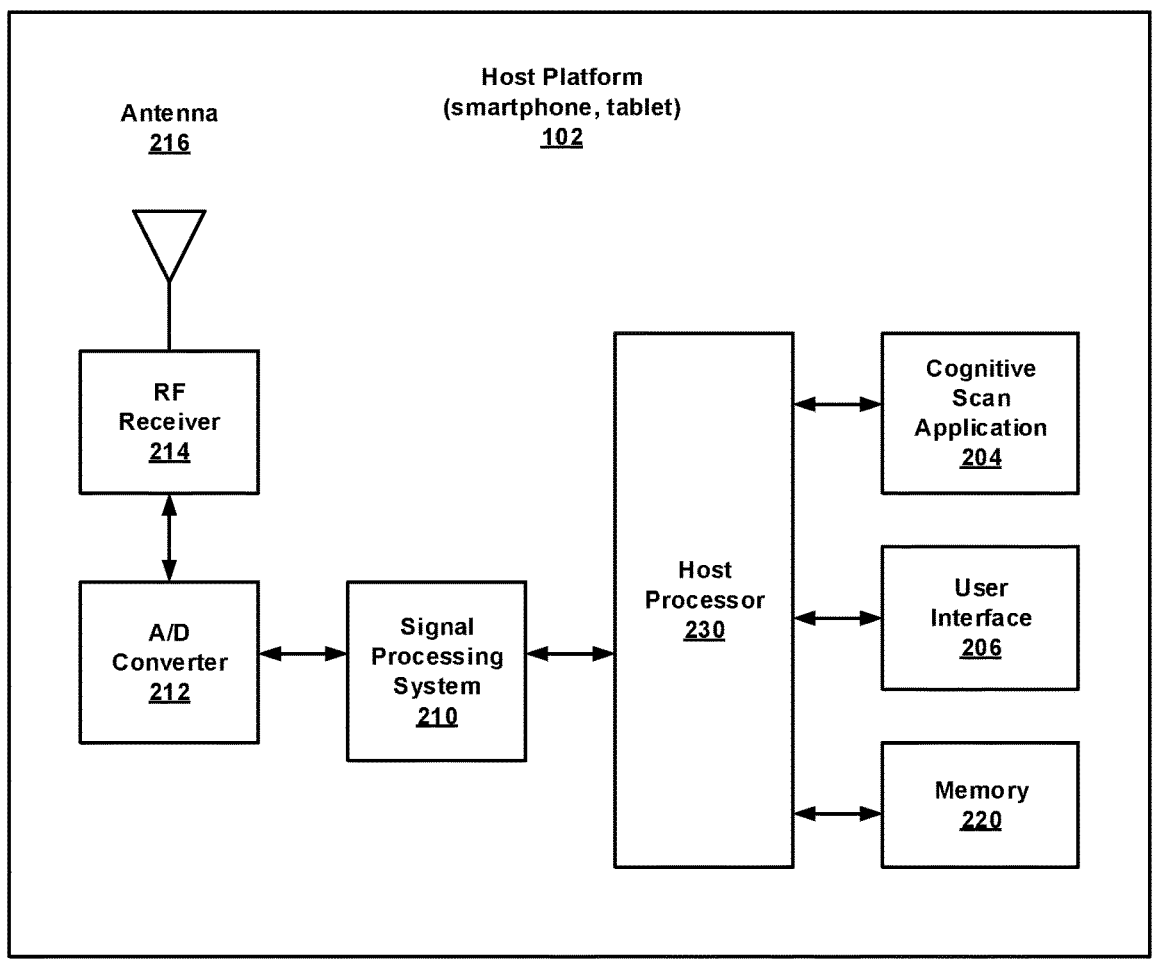
Figure 14C:
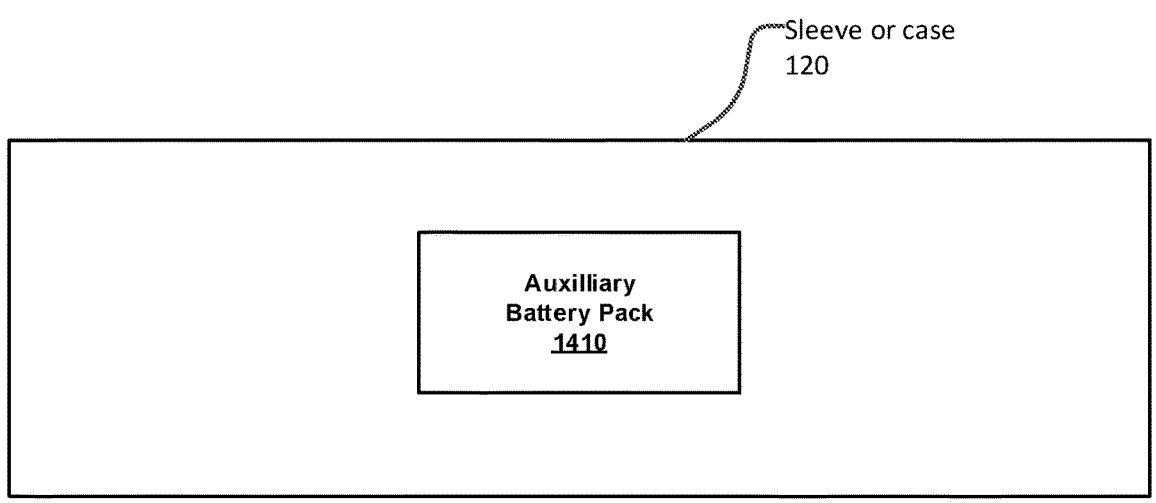

FIGS. 14A, 14B, and 14C illustrate example configuration variations of the spectrum analyzer system host platform and signal analyzer co-processing unit, in accordance with certain of the embodiments disclosed herein. In the embodiment illustrated in FIG. 14a, the signal acquisition and processing is performed on the sleeve or the protective case 120 with the resulting information passed to the cognitive scan application 204 through the interface described above. The user interface 206 displays results and provides for user configuration of the signal analyzer co-processor unit 110 (e.g., frequency bands, acquisition timing, and specification of signal of interest). The protective case 120 is also configured to provide an auxiliary or ancillary battery pack to power the signal analyzer 110.

In the embodiment illustrated in FIG. 14b, the configuration is changed such that the signal processing functions (e.g., the DSP or ARM processing cores) are moved from the sleeve or protective case 120 to the host platform 102. Thus, in this example the signal detection and characterization is performed on the host based on signals acquired through the serial interface from the RF section.

In yet another embodiment, illustrated in FIG. 14c, circuitry provided on the host platform 102, including processing and RF capabilities, is used for both cellular telephony as well as detection and characterization of signals. In this embodiment, the protective sleeve or case 120 serves to provide the auxiliary battery pack 1410. It will be appreciated, however, that numerous other configurations are possible in which the functionality of the system may be distributed to varying degrees between the host platform 102 and the protective sleeve or case 120.

Figure 17:
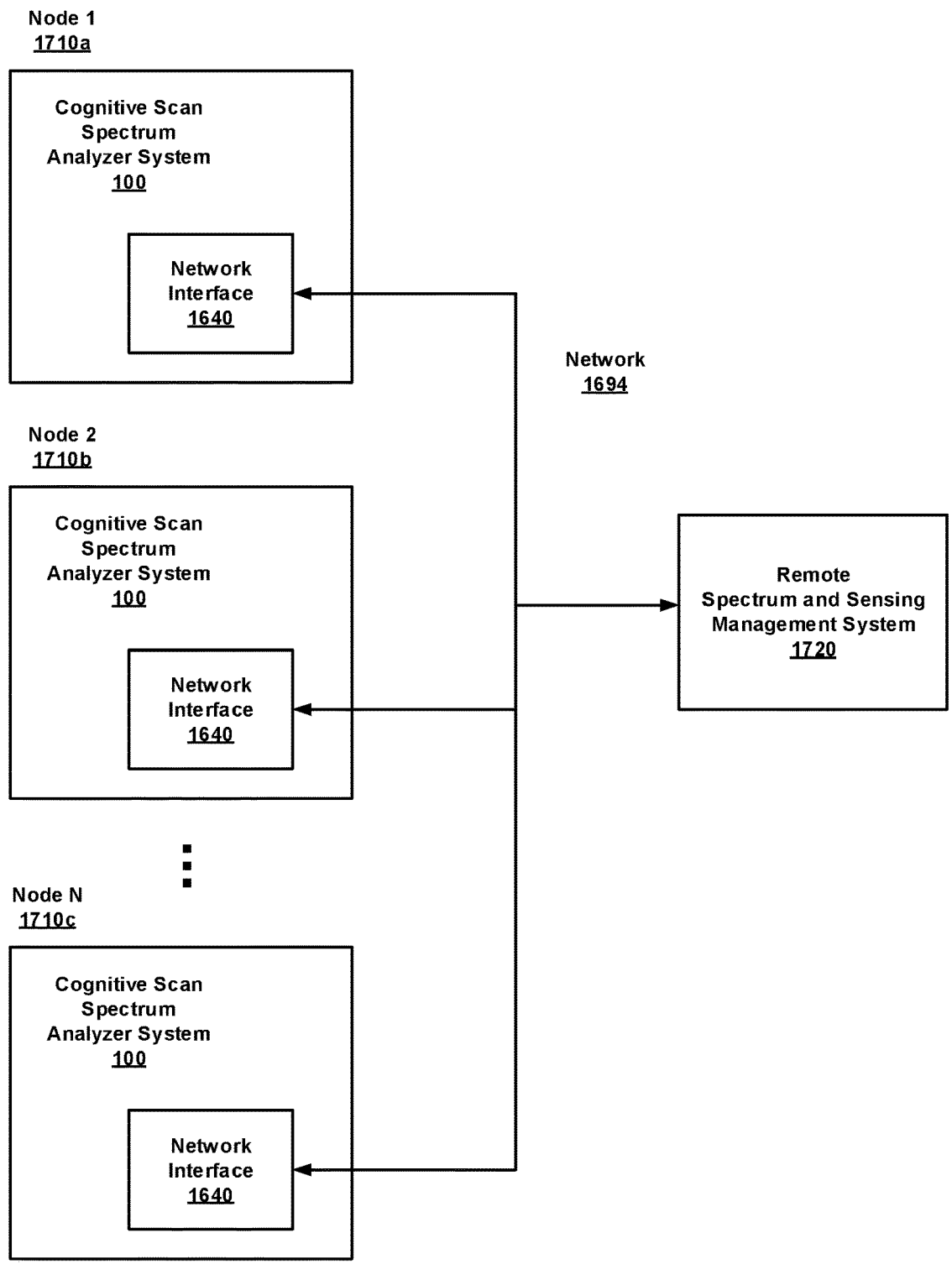
FIG. 17 is a block diagram schematically illustrating a remote spectrum and sensing management system, configured in accordance with certain of the embodiments disclosed herein.

With reference now to FIG. 17, a block diagram 1700 is shown, schematically illustrating deployment of a remote spectrum and sensing management system 1720, configured in accordance with certain of the embodiments disclosed herein. In some embodiments, multiple cognitive scan spectrum analyzers systems 100 may be configured as nodes 1710*a*, 1710*b*, . . . 1710*c* on a network 1694. A remote spectrum and sensing management system 1720 may be configured to communicate with each of these nodes over the network to interact (e.g., control and collect information) from each of the nodes. Network communication may be implemented using any appropriate protocol including, for example, Wi-Fi (IEEE 802.11), Wi-Far (IEEE 802.22), 2G, 3G, 4G, 5G, LTE, or LTE-advanced communications protocol that may be available on the host platform 102, signal analyzer 110, or casing 120. In some embodiments, communication between the nodes 1710 and the remote management system 1720 may be performed by network interface 1640, as previously described. In some embodiments, the IEEE 802.22.3 Spectrum Characterization and Occupancy Sensing Standard Protocol may be implemented on top of the Wi-Fi, Wi-FAR, 2G/3G/4G/5G/LTE services to provide the information in a standardized format.

In some embodiments, the remote spectrum and sensing management system 1720 may configure the cognitive scan application on one or more of the nodes 1710, and receive results on a periodic basis as desired. For example, the remote spectrum and sensing management system may employ the cognitive scan analysis results from the nodes to detect and identify interference to a cellular telephone service.

Figure 18:
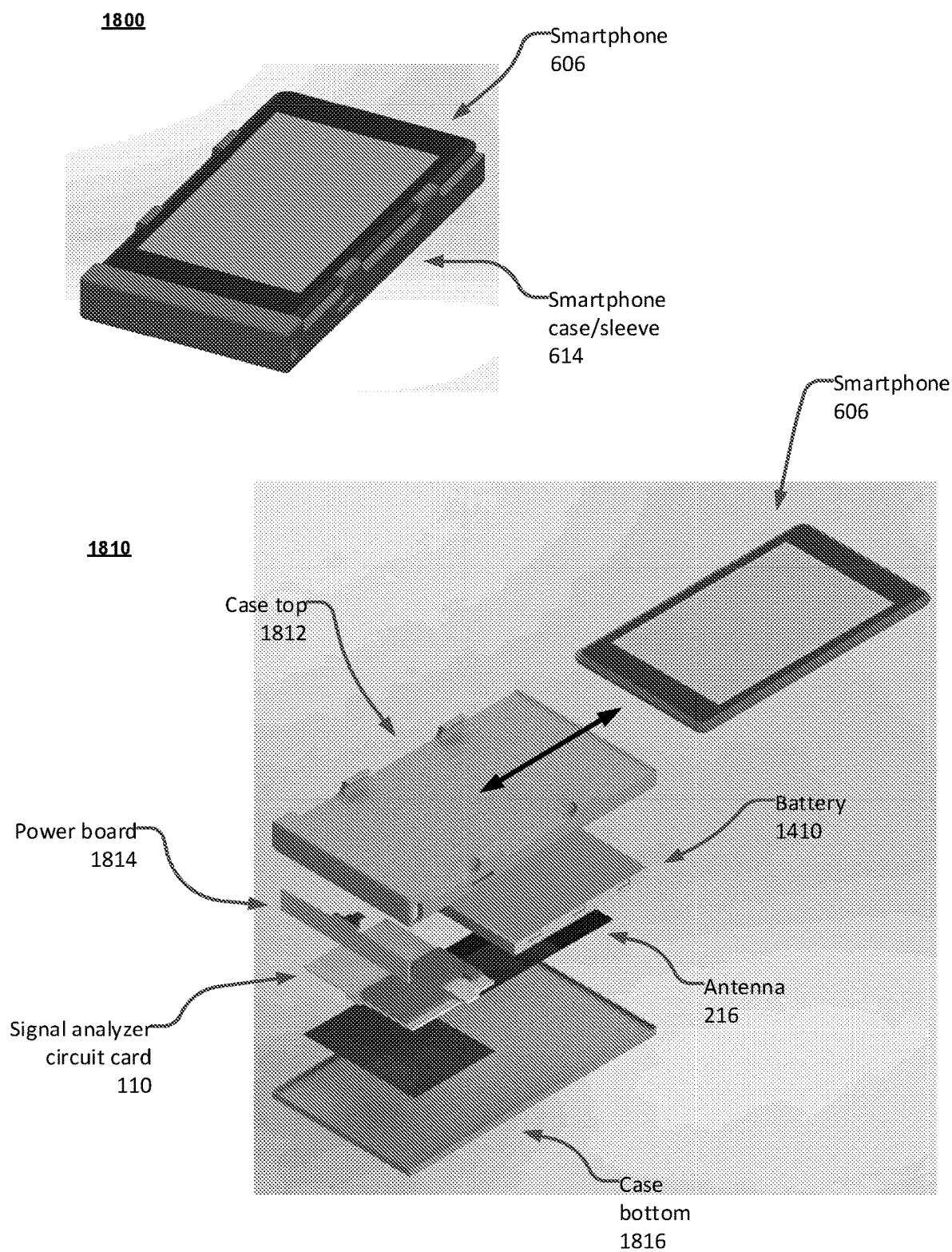
FIG. 18 illustrates an exploded view of a smartphone case, configured in accordance with certain of the embodiments disclosed herein.

With reference now to FIG. 18, an exploded view 1810 of a smartphone case is shown, configured in accordance with certain of the embodiments disclosed herein. The smartphone 606 is initially shown, at 1800, as being inserted into the smartphone case 614. At 1810, an exploded view of the case is shown to include a case top 1812, a power board 1814, battery 1410, antenna 216, the signal analyzer circuit card 110, and a case bottom 1860. The case top 1812 is configured to allow the smartphone 606 to slide in, dock, and be securely captured by the case, as shown. In some embodiments, the power board 1814 may be configured to include a USB charging port, a USB micro B dock port, and power handling circuitry such as a DC/DC converter. In some further embodiments, the LNA circuit may also be integrated onto the power board. Although one antenna 216 is shown in this illustration, any number of additional antennas may be integrated into the case.

Methodology

Figure 15:
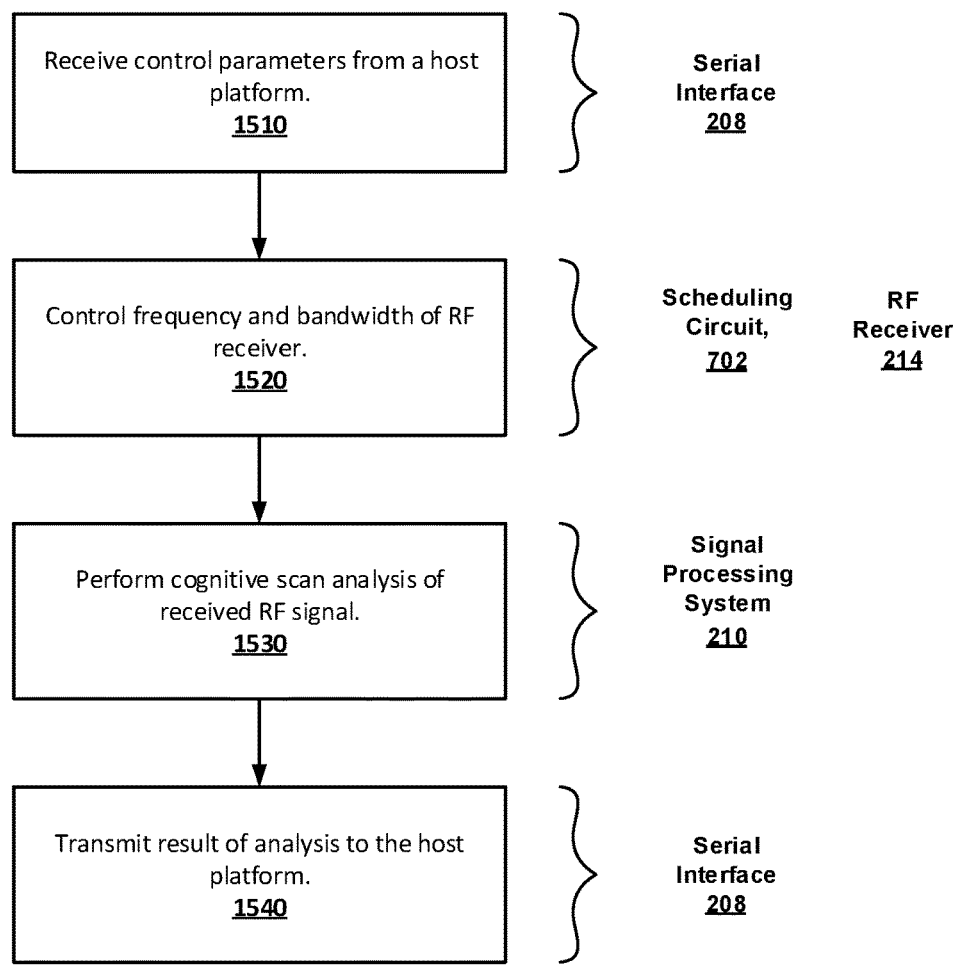
FIG. 15 is a flowchart illustrating a methodology for implementation of a portable spectrum analyzer, in accordance with certain of the embodiments disclosed herein.

FIG. 15 is a flowchart illustrating an example method 1500 for implementation of a portable spectrum analyzer, in accordance with an embodiment of the present disclosure. As can be seen, example method 1500 includes a number of phases and sub-processes, the sequence of which may vary from one embodiment to another. However, when considered in the aggregate, these phases and sub-processes form a process for signal analysis on a portable or small form factor platform, in accordance with certain of the embodiments disclosed herein. These embodiments can be implemented, for example using the system architecture illustrated in FIGS. 1, 2, 5, 7-10, and 15-17, as described herein. However other system architectures can be used in other embodiments, as will be apparent in light of this disclosure. To this end, the correlation of the various functions shown in FIG. 15 to the specific components illustrated in FIGS. 1, 2, 5, 7-10, and 15-17, is not intended to imply any structural and/or use limitations. Rather other embodiments may include, for example, varying degrees of integration wherein multiple functionalities are effectively performed by one system. For example, in an alternative embodiment a single module can be used to perform all of the functions of method 1500. Thus, other embodiments may have fewer or more modules and/or sub-modules depending on the granularity of implementation. Numerous variations and alternative configurations will be apparent in light of this disclosure.

As illustrated in FIG. 15, in one embodiment, method 1500 for implementation of a portable spectrum analyzer commences, at operation 1510, by receiving parameters from a host platform over a serial interface. The parameters control the operation of a cognitive scanning analysis, for example specifying frequencies, bandwidths, and signals of interest.

Next, at operation 1520, the tuning frequency and bandwidth of an RF receiver are controlled. The controlling may be performed by a signal processor that is integrated with the RF receiver on a co-processor circuit card.

At operation 1530, the signal processor performs the cognitive scanning analysis of an RF signal provided by the RF receiver. The cognitive scanning analysis includes detection, identification, and characterization of one or more digital signals that may be embedded in the received RF signal.

At operation 1540, the results of the cognitive scanning analysis are transmitted over the serial interface to the host platform. The host platform is a mobile platform that is physically coupled to the co-processor circuit card through the use of a shared case or enclosure. In some embodiments, the enclosure may be a sleeve, a wallet, or a hinged folder (e.g., similar to a book cover). The case may comprise two sections or sides: one side to contain the signal analyzer co-processor circuit card 110, and another side to contain the mobile host platform 102. In a further embodiment, the mobile platform is contained in a first case and the signal processing system is contained in a second separate case. The mobile platform and the signal processing system are coupled together via the interface and the combination is collectively considered to be a shared case. In some embodiments, the mobile host platform may be a smartphone, tablet, or laptop, and the serial interface may be a USB communications link, a micro-USB communications link, or an Ethernet communications link.

Of course, in some embodiments, additional operations may be performed, as previously described in connection with the system. These additional operations may include, for example, displaying results on a user interface, or screen, of the mobile platform. Results may include a power spectral density plot of the detected digital signals, a labeled identification of the detected digital signals, and/or a list of characteristic parameters associated with the detected digital signals.

In some further embodiments, the cognitive scanning analysis detection may be based on one or more of Higher-Order Statistics Analysis, Tunnelized Cyclo-Stationary Processing, Exhaustive Cyclo-Stationary Processing, and Cyclic Prefix Signal Detection. Additionally, the cognitive scanning analysis identification and characterization (e.g., classification) may be based on one or more of Clustering Analysis, Support Vector Machine (SVM) techniques, Linear Discrimination Analysis, and Time Frequency Pattern Analysis. The Time Frequency Pattern Analysis may employ one or more of Artificial Neural Networks, Deep Neural Networks, Convolutional Neural Networks, Bayesian Networks, and Hidden Markov Models.

Example System

Figure 16:
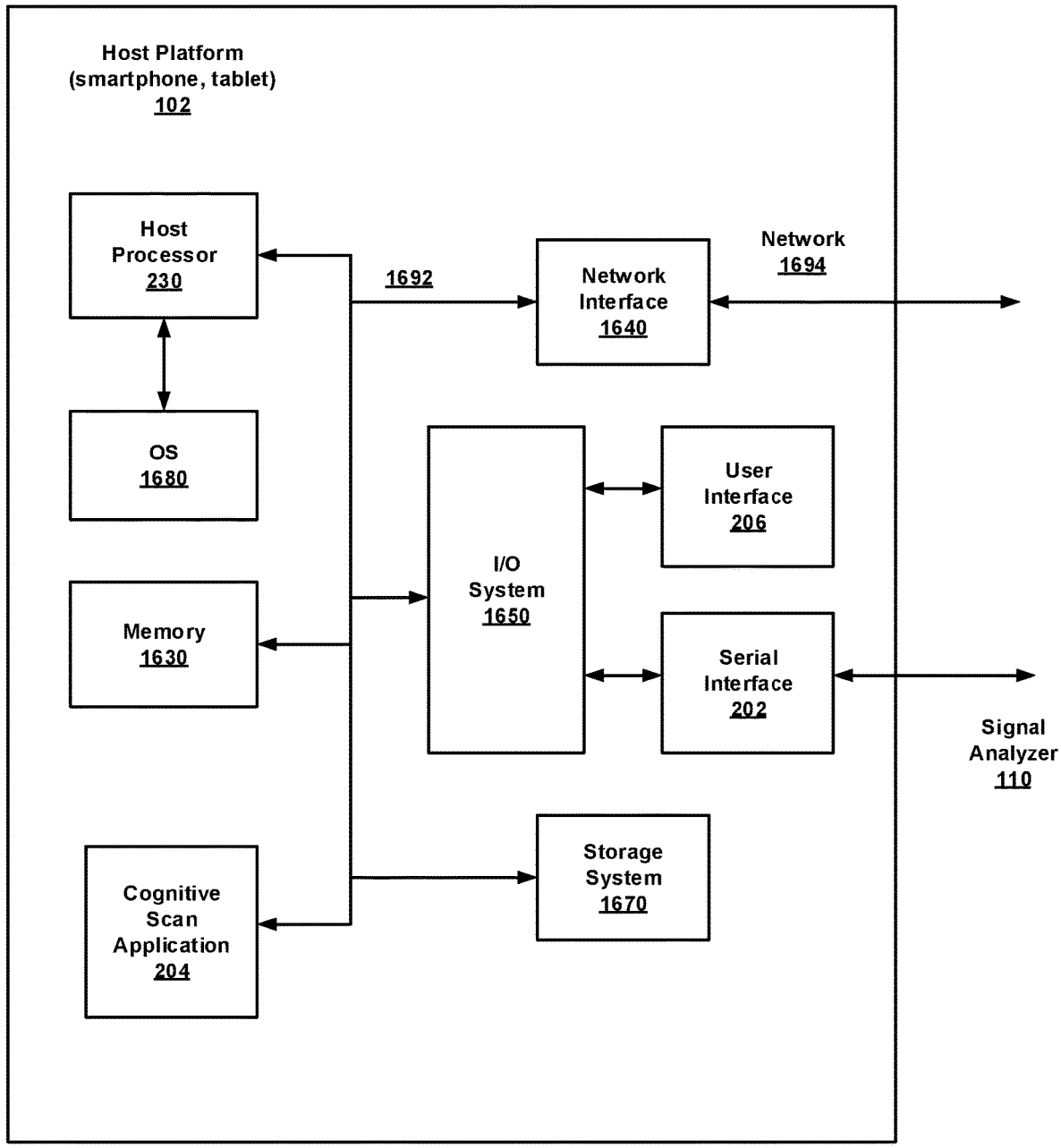
FIG. 16 is a block diagram schematically illustrating a host platform configured to implement a portable spectrum analyzer, in accordance with certain of the embodiments disclosed herein.

FIG. 16 is a block diagram schematically illustrating a host platform 102 configured to implement a portable spectrum analyzer, in accordance with certain of the embodiments disclosed herein. In some embodiments, host platform 102 may be a smartphone, a tablet, a laptop, or any other mobile communication/computation device, such as, for example, a touchpad, portable computer, handheld computer, palmtop computer, personal digital assistant (PDA), cellular telephone, combination cellular telephone and PDA, mobile internet device (MID), messaging device, data communication device, and so forth. Any combination of different devices may be used in certain embodiments.

In some embodiments, platform 102 may comprise any combination of a processor 230, a memory 1630, a network interface 1640, an input/output (I/O) system 1650, storage system 1670, user interface 206, serial interface 202, along with cognitive scan application 204, as described herein. As can be further seen, a bus and/or interconnect 1692 is also provided to allow for communication between the various components listed above and/or other components not shown. Platform 1610 can be coupled to a network 1694 through network interface 1640 to allow for communications with other computing systems and platforms, including other spectrum analyzer systems that may be configured to provide data and/or be controlled by a remote sensing management system, as described below. Other componentry and functionality not reflected in the block diagram of FIG. 16 will be apparent in light of this disclosure, and it will be appreciated that other embodiments are not limited to any particular hardware configuration.

Processor 230 can be any suitable processor, and may include one or more coprocessors or controllers, to assist in control and processing operations associated with system 1600. In some embodiments, the processor 230 may be implemented as any number of processor cores. The processor (or processor cores) may be any type of processor, such as, for example, a micro-processor, an embedded processor, a digital signal processor (DSP), a general purpose graphics processor unit (GPGPU), a network processor, a field programmable gate array, an ARM processor, or other device configured to execute code. The processors may be multithreaded cores in that they may include more than one hardware thread context (or "logical processor") per core. Processor 230 may be implemented as a complex instruction set computer (CISC) or a reduced instruction set computer (RISC) processor.

Memory 1630 can be implemented using any suitable type of digital storage including, for example, flash memory and/or random access memory (RAM). In some embodiments, the memory 1630 may include various layers of memory hierarchy and/or memory caches as are known to those of skill in the art. Memory 1630 may be implemented as a volatile memory device such as, but not limited to, a RAM, dynamic RAM (DRAM), or static RAM (SRAM) device. Storage system 1670 may be implemented as a non-volatile storage device such as, but not limited to, one or more of a hard disk drive (HDD), a solid-state drive (SSD), a universal serial bus (USB) drive, an optical disk drive, an internal storage device, an attached storage device, flash memory, battery backed-up synchronous DRAM (SDRAM), mini Secure Digital (mini SD) or micro Secure Digital (microSD) storage, and/or a network accessible storage device. In some embodiments, storage 1670 may comprise technology to increase the storage performance enhanced protection for valuable digital media when multiple hard drives are included.

Processor 230 may be configured to execute an Operating System (OS) 1680 which may comprise any suitable operating system, such as, for example, Google Android (Google Inc., Mountain View, Calif.) development environment, Microsoft Windows (Microsoft Corp., Redmond, Wash.), Linux, Apple OS X or iOS (Apple Inc., Cupertino, Calif.) and/or various real-time operating systems (RTOSs). As will be appreciated in light of this disclosure, the techniques provided herein can be implemented without regard to the particular operating system provided in conjunction with system 1600, and therefore may also be implemented using any suitable existing or subsequently-developed platform.

Network interface circuit 1640 can be any appropriate network chip or chipset which allows for wired and/or wireless connection between other components of computer system 1600 and/or network 1694, thereby enabling system 1600 to communicate with other local and/or remote computing systems, servers, and/or resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks. In some embodiments, the information to be communicated may be embedded in other protocols specifically used for spectrum sensing, such as IEEE 802.22.3 (Spectrum Characterization and Occupancy Sensing), Vita 49.2, or the P1900.6 family of standards.

I/O system 1650 may be configured to interface between various I/O devices and other components of computer system 1600. I/O devices may include, but not be limited to, serial interfaced 202 and user interface 206. Serial interface may be a universal serial bus (USB), micro-USB, or other suitable communications link. User interface 206 may include devices (not shown) such as a display element, touchpad, keyboard, mouse, microphone, and speaker, etc. I/O system 1650 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 230 or any chipset of platform 102.

It will be appreciated that in some embodiments, the various components of the system 1600 may be combined or integrated in a system-on-a-chip (SoC) architecture. In some embodiments, the components may be hardware components, firmware components, software components or any suitable combination of hardware, firmware or software.

Cognitive scan application 204 provides capability to display results of the cognitive scanning analysis on the user interface and to receive control parameters from a user, through the user interface. The parameters control the operation of the cognitive scanning analysis, for example specifying frequencies, bandwidths, and signals of interest. Results may include a power spectral density plot of the detected digital signals, a labeled identification of the detected digital signals, and/or a list of characteristic parameters associated with the detected digital signals, in accordance with embodiments of the present disclosure. Cognitive scan application 204 can be implemented or otherwise used in conjunction with a variety of suitable software and/or hardware that is coupled to or that otherwise forms a part of system 1600.

In various embodiments, system 1600 may be implemented as a wireless system, a wired system, or a combination of both. When implemented as a wireless system, system 1600 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, system 1600 may include components and interfaces suitable for communicating over wired communications media, such as input/output adapters, physical connectors to connect the input/output adaptor with a corresponding wired communications medium, a network interface card (NIC), and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, ARM processor, GPGPU, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the cognitive scan application methodologies disclosed herein to be implemented. The instructions can be encoded using a suitable programming language, such as C, C++, object oriented C, Java, JavaScript, Groovy, CUDA Platform, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. The computer software applications disclosed herein may include any number of different modules, sub-modules, or other components of distinct functionality, and can provide information to, or receive information from, still other components. Other componentry and functionality not reflected in the illustrations will be apparent in light of this disclosure, and it will be appreciated that other embodiments are not limited to any particular hardware or software configuration. Thus, in other embodiments system 1600 may comprise additional, fewer, or alternative subcomponents as compared to those included in the example embodiment of FIG. 16.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, miniSD, microSD, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), ARM processor, logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a portable spectrum analyzer. The spectrum analyzer includes: a signal analyzer including a radio frequency (RF) receiver to receive an RF signal from an antenna, the antenna coupled to the RF receiver, an analog to digital (A/D) converter circuit to generate a sampled signal based on the received RF signal, and a signal processing system to perform cognitive scanning analysis of the sampled signal, the cognitive scanning analysis to include detection, identification, and characterization of one or more digital signals embedded in the sampled signal. The spectrum analyzer also includes a mobile host platform and an interface circuit to provide communication between the signal analyzer and the mobile host platform. The communication includes transmitting of results of the cognitive scanning analysis from the signal analyzer to the mobile host platform, and receiving of parameters by the signal analyzer from the mobile host platform, the parameters to control the operation of the cognitive scanning analysis.

In some cases, the mobile host platform includes a user interface and a host processor to execute a cognitive scanning application, the cognitive scanning application to present the results of the cognitive scanning analysis on the user interface and to receive control parameters from a user, through the user interface. In some such cases, the host processor is further to perform at least a portion of the cognitive scanning analysis.

In some cases, the interface circuit is a serial interface circuit to support at least one of a universal serial bus (USB) communications link, a micro-USB communications link, an Ethernet communications link, and a wireless communications link.

In some cases, the mobile host platform is one of a smartphone, a tablet, and a laptop. In some cases, the results of the cognitive scanning analysis include at least one of a power spectral density plot of the detected one or more digital signals, a labeled identification of the detected one or more digital signals, and a list of characteristic parameters associated with the detected one or more digital signals.

In some cases, the signal processing system further includes: a scheduling circuit to control a tuning frequency and bandwidth of the RF receiver; a processing circuit to detect the one or more digital signals; and a backend processing circuit to classify the detected one or more digital signals based on at least one of Exhaustive Cyclo-Stationary Processing, Clustering Analysis, Support Vector Machine (SVM) techniques, Linear Discrimination Analysis, Time Frequency Pattern Analysis, Singular Value Decomposition (SVD), Deep Neural Networks (DNN), Convolutional Neural Networks (CNN), Hidden Markov Models (HMM) and Bayesian Networks (BN). In some such cases, the processing circuit further includes a low complexity processing circuit to perform higher-order statistics analysis to detect the one or more digital signals. In some such cases, the processing circuit further includes a high complexity processing circuit to perform at least one of Exhaustive Cyclo-Stationary Processing and Cyclic Prefix Signal Detection, to detect the one or more digital signals. In some such cases, the Time Frequency Pattern Analysis employs at least one of Artificial Neural Networks, Bayesian Networks (BN), Deep Neural Networks (DNN), Convolutional Neural Networks (CNN), and Hidden Markov Models (HMM).

Another example embodiment of the present disclosure provides a portable spectrum analyzer. The spectrum analyzer includes: a mobile host platform including a host processor to perform a cognitive scanning analysis of a sampled signal, the cognitive scanning analysis to include detection, identification, and characterization of one or more digital signals embedded in the sampled signal; a co-processing circuit card including a radio frequency (RF) receiver to receive an RF signal from an antenna, the antenna coupled to the RF receiver, and an analog to digital (A/D) converter circuit to generate the sampled signal based on the received RF signal; an interface circuit to provide communication between the mobile host platform and the co-processing circuit card; wherein the communication includes transmitting of sampled signal from the co-processing circuit card to the mobile host platform, and receiving of parameters by the co-processing circuit card from the mobile host platform, the parameters to control at least one of acquisition and processing of the RF signal.

In some cases, the mobile host platform further includes a user interface; and the host processor is further to execute a cognitive scanning application, the cognitive scanning application to present the results of the cognitive scanning analysis on the user interface and to receive control parameters from a user, through the user interface. In some cases, the interface circuit is a serial interface circuit to support at least one of a universal serial bus (USB) communications link, a micro-USB communications link, an Ethernet communications link, and a wireless communications link. In some cases, the mobile host platform is one of a smartphone, a tablet, and a laptop. In some cases, the results of the cognitive scanning analysis include at least one of a power spectral density plot of the detected one or more digital signals, a labeled identification of the detected one or more digital signals, and a list of characteristic parameters associated with the detected one or more digital signals.

Another example embodiment of the present disclosure provides a method for signal analysis. The method includes: controlling, by a signal processor, a tuning frequency and bandwidth of an RF receiver, wherein the signal processor and RF receiver are integrated on a co-processor circuit card; performing, by the signal processor, a cognitive scanning analysis of an RF signal provided by the RF receiver, the cognitive scanning analysis including detection, identification, and characterization of one or more digital signals embedded in the received RF signal; transmitting, by a serial interface, results of the cognitive scanning analysis to a host platform, wherein the host platform is a mobile platform coupled to the co-processor circuit card; and receiving, by the serial interface, parameters from the host platform, the parameters to control the operation of the cognitive scanning analysis.

In some cases, the serial interface supports at least one of a universal serial bus (USB) communications link, a micro-USB communications link, an Ethernet communications link, and a wireless communications link. In some case, the host platform is one of a smartphone, a tablet, and a laptop.

In some cases, the method further includes executing, by a host processor associated with the host platform, a cognitive scanning application, the cognitive scanning application to present the results of the cognitive scanning analysis on a user interface of the host platform, and to receive control parameters from a user, through the user interface. In some such cases, the results of the cognitive scanning analysis include at least one of a power spectral density plot of the detected one or more digital signals, a labeled identification of the detected one or more digital signals, and a list of characteristic parameters associated with the detected one or more digital signals.

In some cases, the method further includes performing, by the signal processor, at least one of Higher-Order Statistics Analysis, Exhaustive Cyclo-Stationary Processing and Cyclic Prefix Signal Detection, to detect the one or more digital signals.

In some cases, the method further includes classifying, by the signal processor, the detected one or more digital signals based on at least one of Exhaustive Cyclo-Stationary Processing, Clustering Analysis, Support Vector Machine (SVM) techniques, Singular Value Decomposition (SVD), Linear Discrimination Analysis, and Time Frequency Pattern Analysis.

In some cases, the method further includes performing detection, characterization, and geolocation of sources of interference to communications systems, based on the results of the cognitive scanning analysis. In some cases, the method further includes identifying unused spectrum for dynamic spectrum allocation to enable communication between combinations of defense systems and commercial systems. In some cases, the method further includes performing identification of signals associated with threats and identification of signals to be suppressed.

Another example embodiment of the present disclosure provides a portable spectrum analyzer. The spectrum analyzer includes: a signal analyzer including a radio frequency (RF) receiver to receive an RF signal from an antenna, the antenna coupled to the RF receiver, an analog to digital (A/D) converter circuit to generate a sampled signal based on the received RF signal, and a signal processing system to perform cognitive scanning analysis of the sampled signal, the cognitive scanning analysis to include detection, identification, and characterization of one or more digital signals embedded in the sampled signal; and a mobile host platform; wherein the signal analyzer and the mobile host platform are coupled through a shared case.

In some cases, the mobile host platform and the signal analyzer are coupled by at least one of a wired interface and a wireless interface. In some cases, the case includes a hinged arrangement that contains the signal analyzer and the mobile host platform during periods of non-use, and can be opened during periods of use. In some cases, the case is at least one of a sleeve, a wallet, and a hinged folder, the case including a first side to contain the signal analyzer and a second side to contain the mobile host platform.

In some cases, the mobile host platform includes: a user interface; and a host processor to execute a cognitive scanning application, the cognitive scanning application to present the results of the cognitive scanning analysis on the user interface and to receive control parameters from a user, through the user interface. In some such cases, the user interface is further to provide controls to perform at least one of starting a cognitive scanning analysis, repeating a cognitive scanning analysis, and stopping a cognitive scanning analysis. In some such cases, the user interface is further to provide controls to enable the user to perform at least one of scrolling the display and selecting from among a plurality of display screens, to focus on a signal of interest. In some such cases, the user interface is a touchscreen configured to enable the user to tap on a displayed signal label to select a signal associated with the label for cognitive scanning analysis or for display of cognitive scanning analysis results. In some such cases, the host processor is further to perform at least a portion of the cognitive scanning analysis.

In some cases, the spectrum analyzer further includes a network interface to provide communication between the spectrum analyzer and a Remote Spectrum and Sensing Management System, wherein the communication includes transmitting results of the cognitive scanning analysis and receiving configuration parameters to control the operation of the cognitive scanning analysis.

Another example embodiment of the present disclosure provides a method for signal analysis. The method includes: controlling, by a signal processor, a tuning frequency and bandwidth of an RF receiver, wherein the signal processor and RF receiver are integrated on a co-processor circuit card; performing, by the signal processor, a cognitive scanning analysis of an RF signal provided by the RF receiver, the cognitive scanning analysis including detection, identification, and characterization of one or more digital signals embedded in the received RF signal; and receiving, by a serial interface, parameters from a host platform, the parameters to control the operation of the cognitive scanning analysis, wherein the host platform is a mobile platform coupled to the co-processor circuit card through a shared case.

In some cases, the method also includes providing controls through the user interface to perform at least one of starting a cognitive scanning analysis, repeating a cognitive scanning analysis, stopping a cognitive scanning analysis, and selecting a display of the results of the cognitive scanning analysis of one or more of the digital signals. In some cases, the method further includes communicating with a Remote Spectrum and Sensing Management System to transmit results of the cognitive scanning analysis and receive configuration parameters to control the operation of the cognitive scanning analysis. In some cases, the method further includes performing at least one of spectrum management, spectrum planning, spectrum allocation, and spectrum mapping, based on the results of the cognitive scanning analysis.

In some cases, the method further includes performing detection, characterization, and geolocation of sources of interference to a wireless communications infrastructure, based on the results of the cognitive scanning analysis. In some cases, the method further includes identifying unused spectrum for dynamic spectrum allocation, based on the results of the cognitive scanning analysis. In some cases, the method further includes analyzing terrain topology for determination of signal shadowing and fading effects, based on the results of the cognitive scanning analysis. In some cases, the method further includes identifying spectrum holes in at least one of space, time, and frequency, based on the results of the cognitive scanning analysis, for the assignment of non-time-sensitive spectrum usage tasks.

Another example embodiment of the present disclosure provides a portable spectrum analyzer, comprising: a signal analyzer including a radio frequency (RF) receiver to receive an RF signal from an antenna, the antenna coupled to the RF receiver, an analog to digital (A/D) converter circuit to generate a sampled signal based on the received RF signal, and a signal processing system to perform cognitive scanning analysis of the sampled signal, the cognitive scanning analysis to include detection, identification, and characterization of one or more digital signals embedded in the sampled signal based on Tunnelized Cyclo-Stationary Processing; a mobile host platform; and an interface circuit to provide communication between the signal analyzer and the mobile host platform. The communication includes transmitting of results of the cognitive scanning analysis from the signal analyzer to the mobile host platform, and receiving of parameters by the signal analyzer from the mobile host platform, the parameters to control the operation of the cognitive scanning analysis.

In some cases, the signal processing system further includes: a scheduling circuit to control a tuning frequency and bandwidth of the RF receiver; a processing circuit to detect the one or more digital signals; and a backend processing circuit to classify the detected one or more digital signals based on at least one of Tunnelized Cyclo-Stationary Processing, Exhaustive Cyclo-Stationary Processing, Strip Spectral Correlation Analysis (SSCA), Clustering Analysis, Support Vector Machine (SVM) techniques, Linear Discrimination Analysis, Time Frequency Pattern Analysis, Singular Value Decomposition (SVD), Deep Neural Networks (DNN), Convolutional Neural Networks (CNN), Hidden Markov Models (HMM) and Bayesian Networks (BN).

In some cases, the portable spectrum analyzer further includes: a mobile host platform including a host processor to perform a cognitive scanning analysis of a sampled signal, the cognitive scanning analysis to include detection, identification, and characterization of one or more digital signals embedded in the sampled signal based on Tunnelized Cyclo-Stationary Processing; a co-processing circuit card including a radio frequency (RF) receiver to receive an RF signal from an antenna, the antenna coupled to the RF receiver, and an analog to digital (A/D) converter circuit to generate the sampled signal based on the received RF signal; an interface circuit to provide communication between the mobile host platform and the co-processing circuit card. The communication includes transmitting of sampled signal from the co-processing circuit card to the mobile host platform, and receiving of parameters by the co-processing circuit card from the mobile host platform, the parameters to control at least one of acquisition and processing of the RF signal.

Another example embodiment of the present disclosure provides a method for signal analysis. The method includes: controlling, by a signal processor, a tuning frequency and bandwidth of an RF receiver, wherein the signal processor and RF receiver are integrated on a co-processor circuit card; performing, by the signal processor, a cognitive scanning analysis of an RF signal provided by the RF receiver, the cognitive scanning analysis including detection, identification, and characterization of one or more digital signals embedded in the received RF signal based on Tunnelized Cyclo-Stationary Processing; transmitting, by a serial interface, results of the cognitive scanning analysis to a host platform, wherein the host platform is a mobile platform coupled to the co-processor circuit card; and receiving, by the serial interface, parameters from the host platform, the parameters to control the operation of the cognitive scanning analysis. In some cases, the method also includes performing, by the signal processor, higher-order statistics analysis to detect the one or more digital signals.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A portable spectrum analyzer, comprising:
a signal analyzer including
a radio frequency (RF) receiver to receive an RF signal from an antenna, the antenna coupled to the RF receiver,
an analog to digital (A/D) converter circuit to generate a sampled signal based on the received RF signal, and
a signal processing system to perform cognitive scanning analysis of the sampled signal based on control parameters, the cognitive scanning analysis to include detection, identification, and characterization of one or more digital signals embedded in the sampled signal, the control parameters to specify frequencies, bandwidths, and signals of interest for the cognitive scanning analysis; and
a mobile host platform to communicate the control parameters to the signal analyzer;
wherein the signal analyzer and the mobile host platform are communicatively coupled through a shared case.

2. The spectrum analyzer of claim 1, wherein the mobile host platform and the signal analyzer are coupled by at least one of a wired interface and a wireless interface.

3. The spectrum analyzer of claim 1, wherein the case comprises a hinged arrangement that contains the signal analyzer and the mobile host platform during periods of non-use, and can be opened during periods of use.

4. The spectrum analyzer of claim 1, wherein the case is at least one of a sleeve, a wallet, and a hinged folder, the case comprising a first side to contain the signal analyzer and a second side to contain the mobile host platform.

5. The spectrum analyzer of claim 1, wherein the mobile host platform comprises:
a user interface; and
a host processor to execute a cognitive scanning application, the cognitive scanning application to present the results of the cognitive scanning analysis on the user interface and to receive the control parameters from a user, through the user interface.

6. The spectrum analyzer of claim 5, wherein the user interface is further to provide controls to perform at least one of starting a cognitive scanning analysis, repeating a cognitive scanning analysis, and stopping a cognitive scanning analysis.

7. The spectrum analyzer of claim 5, wherein the user interface is further to provide controls to enable the user to perform at least one of scrolling the display and selecting from among a plurality of display screens, to focus on a signal of interest.

8. The spectrum analyzer of claim 5, wherein the user interface is a touchscreen configured to enable the user to tap on a displayed signal label to select a signal associated with the label for cognitive scanning analysis or for display of cognitive scanning analysis results.

9. The spectrum analyzer of claim 5, wherein the host processor is further to perform at least a portion of the cognitive scanning analysis.

10. The spectrum analyzer of claim 1, wherein the mobile host platform is one of a smartphone, a tablet, and a laptop.

11. The spectrum analyzer of claim 1, wherein the results of the cognitive scanning analysis comprise at least one of a power spectral density plot of the detected one or more digital signals, a labeled identification of the detected one or more digital signals, and a list of characteristic parameters associated with the detected one or more digital signals.

12. The spectrum analyzer of claim 1, wherein the signal processing system further comprises:
a scheduling circuit to control a tuning frequency and bandwidth of the RF receiver;
a processing circuit to detect the one or more digital signals; and
a backend processing circuit to classify the detected one or more digital signals based on at least one of Exhaustive Cyclo-Stationary Processing, Clustering Analysis, Support Vector Machine (SVM) techniques, Linear Discrimination Analysis, Time Frequency Pattern Analysis, Singular Value Decomposition (SVD), Deep Neural Networks (DNN), Convolutional Neural Networks (CNN), Hidden Markov Models (HMM) and Bayesian Networks (BN).

13. The spectrum analyzer of claim 1, further comprising a network interface to provide communication between the spectrum analyzer and a Remote Spectrum and Sensing Management System, wherein the communication includes transmitting results of the cognitive scanning analysis and receiving configuration parameters to control the operation of the cognitive scanning analysis.

14. A method for signal analysis, the method comprising:
controlling, by a signal processor, a tuning frequency and bandwidth of an RF receiver, wherein the signal processor and RF receiver are integrated on a co-processor circuit card;
performing, by the signal processor, a cognitive scanning analysis of an RF signal provided by the RF receiver, the cognitive scanning analysis including detection, identification, and characterization of one or more digital signals embedded in the received RF signal; and
receiving, by a serial interface, control parameters from a host platform, the control parameters to control the operation of the cognitive scanning analysis, the control parameters to specify the tuning frequency, the bandwidth, and signals of interest for analysis, wherein the host platform is a mobile platform communicatively coupled to the co-processor circuit card through a shared case.

15. The method of claim 14, wherein the host platform is one of a smartphone, a tablet, and a laptop.

16. The method of claim 14, further comprising executing, by a host processor associated with the host platform, a cognitive scanning application, the cognitive scanning application to present the results of the cognitive scanning analysis on a user interface of the host platform, and to receive the control parameters from a user, through the user interface.

17. The method of claim 16, wherein the results of the cognitive scanning analysis comprise at least one of a power spectral density plot of the detected one or more digital signals, a labeled identification of the detected one or more digital signals, and a list of characteristic parameters associated with the detected one or more digital signals.

18. The method of claim 16, further comprising providing controls through the user interface to perform at least one of starting a cognitive scanning analysis, repeating a cognitive scanning analysis, stopping a cognitive scanning analysis, and selecting a display of the results of the cognitive scanning analysis of one or more of the digital signals.

19. The method of claim 14, further comprising communicating with a Remote Spectrum and Sensing Management System to transmit results of the cognitive scanning analysis and receive configuration parameters to control the operation of the cognitive scanning analysis.

20. The method of claim 14, further comprising performing at least one of spectrum management, spectrum planning, spectrum allocation, and spectrum mapping, based on the results of the cognitive scanning analysis.

21. The method of claim 14, further comprising performing detection, characterization, and geolocation of sources of interference to a wireless communications infrastructure, based on the results of the cognitive scanning analysis.

22. The method of claim 14, further comprising performing identification of unused spectrum for dynamic spectrum allocation, based on the results of the cognitive scanning analysis.

23. The method of claim 14, further comprising performing analysis of terrain topology for determination of signal shadowing and fading effects, based on the results of the cognitive scanning analysis.

24. The method of claim 14, further comprising performing identification of spectrum holes in at least one of space, time, and frequency, based on the results of the cognitive scanning analysis, for the assignment of non-time-sensitive spectrum usage tasks.

* * * * *